(12) United States Patent
Yamazaki

(10) Patent No.: US 8,927,349 B2
(45) Date of Patent: Jan. 6, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/108,840

(22) Filed: Dec. 17, 2013

(65) Prior Publication Data

US 2014/0106506 A1    Apr. 17, 2014

Related U.S. Application Data

(62) Division of application No. 12/957,441, filed on Dec. 1, 2010, now Pat. No. 8,624,245.

(30) Foreign Application Priority Data

Dec. 4, 2009    (JP) ................. 2009-276334

(51) Int. Cl.
*H01L 21/00* (2006.01)
*H01L 21/84* (2006.01)
*H01L 29/786* (2006.01)
*H01L 29/04* (2006.01)
*H01L 29/66* (2006.01)
*H01L 27/12* (2006.01)

(52) U.S. Cl.
CPC ...... *H01L 29/66969* (2013.01); *H01L 29/7869* (2013.01); *H01L 29/78696* (2013.01); *H01L 29/045* (2013.01); *H01L 27/1225* (2013.01)

USPC 438/149; 438/150; 257/E21.32; 257/E21.561; 257/E21.7

(58) Field of Classification Search
USPC .............. 438/149, 150, 151, 166, E21.32, 438/E21.561, E21.7
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    001934712 A    3/2007
CN    101258607 A    9/2008
(Continued)

OTHER PUBLICATIONS

International Search Report (Application No. PCT/JP2010/070955) dated Dec. 28, 2010.

(Continued)

*Primary Examiner* — Hoai V Pham
(74) *Attorney, Agent, or Firm* — Eric J. Robinson; Robinson Intellectual Property Law Office, P.C.

(57) ABSTRACT

A semiconductor device includes an oxide semiconductor layer including a crystalline region over an insulating surface, a source electrode layer and a drain electrode layer in contact with the oxide semiconductor layer, a gate insulating layer covering the oxide semiconductor layer, the source electrode layer, and the drain electrode layer, and a gate electrode layer over the gate insulating layer in a region overlapping with the crystalline region. The crystalline region includes a crystal whose c-axis is aligned in a direction substantially perpendicular to a surface of the oxide semiconductor layer.

14 Claims, 22 Drawing Sheets

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,247,529 B2 | 7/2007 | Shoji et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,791,074 B2 | 9/2010 | Iwasaki |
| 7,800,113 B2 | 9/2010 | Shoji et al. |
| 7,935,582 B2 | 5/2011 | Iwasaki |
| 7,956,361 B2 | 6/2011 | Iwasaki |
| 7,977,169 B2 | 7/2011 | Hirao et al. |
| 8,154,024 B2 | 4/2012 | Iwasaki |
| 8,202,365 B2 | 6/2012 | Umeda et al. |
| 8,203,144 B2 | 6/2012 | Hoffman et al. |
| 8,274,078 B2 | 9/2012 | Itagaki et al. |
| 8,354,674 B2 | 1/2013 | Kimura |
| 8,566,502 B2 | 10/2013 | Vaghani |
| 8,647,031 B2 | 2/2014 | Hoffman et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117071 A1 | 5/2010 | Inoue et al. |
| 2010/0193785 A1 | 8/2010 | Kimura |
| 2010/0219411 A1 | 9/2010 | Hoffman et al. |
| 2010/0244022 A1 | 9/2010 | Takahashi et al. |
| 2010/0320458 A1 | 12/2010 | Umeda et al. |
| 2010/0320459 A1 | 12/2010 | Umeda et al. |
| 2011/0062433 A1 | 3/2011 | Yamazaki |
| 2011/0062436 A1 | 3/2011 | Yamazaki et al. |
| 2011/0127523 A1 | 6/2011 | Yamazaki |
| 2012/0295399 A1 | 11/2012 | Kim et al. |
| 2012/0298988 A1* | 11/2012 | Hara et al. ............. 257/43 |

FOREIGN PATENT DOCUMENTS

| | | |
|---|---|---|
| CN | 101310371 A | 11/2008 |
| EP | 1 737 044 A | 12/2006 |
| EP | 2 226 847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-204197 A | 8/1996 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 | 2/2003 |
| JP | 2003-086000 A | 3/2003 |
| JP | 2003-086808 A | 3/2003 |
| JP | 2003-298062 A | 10/2003 |
| JP | 2004-103957 | 4/2004 |
| JP | 2004-273614 A | 9/2004 |
| JP | 2004-273732 | 9/2004 |
| JP | 2006-100807 A | 4/2006 |

(56) References Cited

FOREIGN PATENT DOCUMENTS

| | | |
|---|---|---|
| JP | 2006-165529 | 6/2006 |
| JP | 2007-096055 | 4/2007 |
| JP | 2007-096129 A | 4/2007 |
| JP | 2007-123861 | 5/2007 |
| JP | 2009-004787 A | 1/2009 |
| JP | 2009-033145 A | 2/2009 |
| JP | 2009-094535 A | 4/2009 |
| JP | 2009-167087 A | 7/2009 |
| JP | 2009-206388 A | 9/2009 |
| JP | 2010-177431 | 8/2010 |
| WO | WO 2004/114391 | 12/2004 |
| WO | WO 2005/088726 | 9/2005 |
| WO | WO 2005/093850 | 10/2005 |
| WO | WO-2007/029844 | 3/2007 |
| WO | WO-2007/094501 | 8/2007 |
| WO | WO 2008/126492 | 10/2008 |
| WO | WO 2008/133345 | 11/2008 |
| WO | WO-2009/034953 | 3/2009 |
| WO | WO 2009/093722 | 7/2009 |

OTHER PUBLICATIONS

Written Opinion (Application No. PCT/JP2010/070955) dated Dec. 28, 2010.
Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda et al., "Full-Functional System Liquid Crystal Display Using CG-Silicon Technology," SID Digest '04: SID International Symposium Digest of Technical Papers, 2004, vol. 35, pp. 860-863.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.
Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.
Prins et al., "A Ferroelectric Transparent Thin-Film Transistor," Appl. Phys. Lett. (Applied Physics Letters), Jun. 17, 1996, vol. 68, No. 25, pp. 3650-3652.
Nakamura et al., "The Phase Relations in the $In_2O_3$-$Ga_2ZnO_4$-ZnO System at 1350°C.," Journal of Solid State Chemistry, Aug. 1, 1991, vol. 93, No. 2, pp. 298-315.
Kimizuka et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System," Journal of Solid State Chemistry, Apr. 1, 1995, vol. 116, No. 1, pp. 170-178.
Nomura et al., "Thin-Film Transistor Fabricated in Single-Crystalline Transparent Oxide Semiconductor," Science, May 23, 2003, vol. 300, No. 5623, pp. 1269-1272.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.
Nomura et al., "Carrier transport in transparent oxide semiconductor with intrinsic structural randomness probed using single-crystalline $InGaO_3(ZnO)5$ films," Appl. Phys. Lett. (Applied Physics Letters), Sep. 13, 2004, vol. 85, No. 11, pp. 1993-1995.
Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Tsuda et al., "Ultra Low Power Consumption Technologies for Mobile TFT-LCDs," IDW '02: Proceedings of the $9^{th}$ International Display Workshops, Dec. 4, 2002, pp. 295-298.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Park et al., "High performance amorphous oxide thin film transistors with self-aligned top-gate structure," IEDM 09: Technical Digest of International Electron Devices Meeting, Dec. 7, 2009, pp. 191-194.
Kurokawa et al., "UHF RFCPUs on Flexible and Glass Substrates for Secure Rfid Systems," Journal of Solid-State Circuits, 2008, vol. 43, No. 1, pp. 292-299.
Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In-Ga-Zn-Oxide TFTs," IDW '09: Proceedings of the $16^{th}$ International Display Workshops, 2009, pp. 689-692.
Park et al., "Amorphous Indium-Gallium-Zinc Oxide TFTs and their Application for Large Size AMOLED," AM-FPD '08 Digest of Technical Papers, Jul. 2, 2008, pp. 275-278.
Park et al., "Challenge to Future Displays: Transparent AM-OLED Driven by Peald Grown ZnO TFT," IMID '07 Digest, 2007, pp. 1249-1252.

(56) References Cited

OTHER PUBLICATIONS

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 in. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_1O_7$ Types of Structures for Compounds in the $In_2O_3$ and $Sc_2O_3$-$A_2O_3$-BO Systems [A: Fe, Ga, or Ai; B: Mg, Mn, Fe, Ni, Cu, or Zn] at Temperatures Over 1000°C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Kim et al., "High Performance Oxide Thin Film Transistors with Double Active Layers", IEDM 08: Technical Digest of International Electron Devices Meeting, Dec. 2008 (4 pages).

* cited by examiner

ENERGY BAND DIAGRAM OF B-B' SECTION (V_G>0)

ENERGY BAND DIAGRAM OF B-B' SECTION (V_G<0)

SEMICONDUCTOR DEVICE AND MANUFACTURING METHOD THEREOF

TECHNICAL FIELD

A technical field of the disclosed invention relates to a semiconductor device including an oxide semiconductor and a manufacturing method of the semiconductor device. Note that semiconductor devices herein refer to general elements and devices which function by utilizing semiconductor characteristics.

BACKGROUND ART

A field-effect transistor is one of the most widely-used semiconductor elements. A variety of materials are used for field-effect transistors according to their uses. In particular, semiconductor materials including silicon are frequently used.

A field-effect transistor including silicon has characteristics satisfying the needs for a variety of uses. For example, single crystal silicon is used for an integrated circuit or the like which needs to be operated at a high speed, whereby the need is satisfied. Further, amorphous silicon is used for an object which needs to have a large area, such as a display device, whereby the need can be satisfied.

As described above, silicon is highly versatile and can be used for various purposes. However, in recent years, semiconductor materials have come to be expected to have higher performance as well as versatility. For example, in terms of improving performance of a large-area display device, in order to realize high-speed operation of a switching element, a semiconductor material which facilitates the increase in area of a display device and shows higher performance than amorphous silicon is needed.

Under such conditions, a technique for a field-effect transistor (also called an FET) including an oxide semiconductor has attracted attention. For example, Patent Document 1 discloses a transparent thin film field-effect transistor including a homologous compound $InMO_3(ZnO)_m$ (M is In, Fe, Ga, or Al, and m is an integer greater than or equal to 1 and less than 50).

In addition, Patent Document 2 discloses a field-effect transistor in which an amorphous oxide semiconductor which contains In, Ga, and Zn and has an electron carrier density less than $10^{18}/cm^3$ is used. Note that in this patent document, the ratio of In atoms to Ga atoms and Zn atoms in the amorphous oxide semiconductor is 1:1:m (m<6).

Further, Patent Document 3 discloses a field-effect transistor in which an amorphous oxide semiconductor including a microcrystal is used for an active layer.

REFERENCE

[Patent Document 1] Japanese Published Patent Application No. 2004-103957
[Patent Document 2] PCT International Publication No. 05/088726
[Patent Document 3] Japanese Published Patent Application No. 2006-165529

DISCLOSURE OF INVENTION

Patent Document 3 discloses that a composition in a crystal state is $InGaO_3(ZnO)_m$ (m is an integer less than 6). Further, Patent Document 3 discloses in Example 1 a case of $InGaO_3(ZnO)_4$. However, adequate characteristics have not been obtained in fact even when such oxide semiconductors are used.

In view of the above-described problems, it is an object to provide a semiconductor device having a novel structure in which an oxide semiconductor layer having a novel structure is used.

In an embodiment of the disclosed invention, a semiconductor device is formed using an oxide semiconductor layer which is purified and includes a crystalline region. The crystalline region is, for example, a region having electrical anisotropy or a region which prevents entry of an impurity.

The following structures can be employed, for example.

An embodiment of the disclosed invention is a semiconductor device which includes an oxide semiconductor layer including a crystalline region over an insulating surface, a source electrode layer and a drain electrode layer in contact with the oxide semiconductor layer, a gate insulating layer covering the oxide semiconductor layer, the source electrode layer, and the drain electrode layer, and a gate electrode layer over the gate insulating layer in a region overlapping with the crystalline region. The crystalline region includes a crystal whose c-axis is aligned in a direction substantially perpendicular to a surface of the oxide semiconductor layer. Note that in this specification and the like, "substantially perpendicular" means being within ±10° from a perpendicular direction.

Another embodiment of the disclosed invention is a semiconductor device which includes a first gate electrode layer over an insulating surface, a first gate insulating layer covering the first gate electrode layer, an oxide semiconductor layer including a crystalline region over the first gate insulating layer, a source electrode layer and a drain electrode layer in contact with the oxide semiconductor layer, a second gate insulating layer covering the oxide semiconductor layer, the source electrode layer, and the drain electrode layer, and a second gate electrode layer over the second gate insulating layer in a region overlapping with the crystalline region. The crystalline region includes a crystal whose c-axis is aligned in a direction substantially perpendicular to a surface of the oxide semiconductor layer.

In addition, an insulating layer having a substantially same shape as the source electrode layer and the drain electrode layer may be provided over the source electrode layer and the drain electrode layer. Note that in this specification and the like, the expression "substantially the same" or "substantially same" does not necessarily mean being exactly the same in a strict sense and can mean being considered as the same. For example, a difference made by a single etching process is acceptable. Further, the thickness does not need to be the same.

In addition, a portion of the source electrode layer and the drain electrode layer in contact with the oxide semiconductor layer may include a material having low oxygen affinity.

A region other than the crystalline region in the oxide semiconductor layer (e.g., a region other than a channel formation region) may have an amorphous structure.

The difference in height of the surface of the oxide semiconductor layer may be 1 nm or less in the region overlapping with the gate electrode layer.

Another embodiment of the disclosed invention is a manufacturing method of a semiconductor device, which includes the steps of: forming an oxide semiconductor layer over an insulating surface; forming a conductive layer over the oxide semiconductor layer; forming a source electrode layer and a drain electrode layer by etching the conductive layer; forming a crystalline region having c-axis aligned in a direction substantially perpendicular to a surface of the oxide semiconductor layer, by performing heat treatment; forming a gate insulating layer so as to cover the oxide semiconductor layer, the source electrode layer, and the drain electrode layer; and forming a gate electrode layer over the gate insulating layer in a region overlapping with the crystalline region.

Another embodiment of the disclosed invention is a manufacturing method of a semiconductor device, which includes the steps of: forming a first gate electrode layer over an insulating surface; forming a first gate insulating layer so as to cover the first gate electrode layer; forming an oxide semiconductor layer over the first gate insulating layer; forming a conductive layer over the oxide semiconductor layer; forming a source electrode layer and a drain electrode layer by etching the conductive layer; forming a crystalline region having c-axis aligned in a direction substantially perpendicular to a surface of the oxide semiconductor layer, by performing heat treatment; forming a second gate insulating layer so as to cover the oxide semiconductor layer, the source electrode layer, and the drain electrode layer; and forming a second gate electrode layer over the second gate insulating layer in a region overlapping with the crystalline region.

In the above embodiment, the heat treatment may be performed at a temperature higher than or equal to 550° C. and lower than or equal to 850° C., preferably higher than or equal to 550° C. and lower than or equal to 750° C. When the conductive layer is etched, a part of the oxide semiconductor layer may be removed. An insulating layer having a substantially same shape as the source electrode layer and the drain electrode layer may be formed over the source electrode layer and the drain electrode layer.

A portion of the source electrode layer and the drain electrode layer in contact with the oxide semiconductor layer may be formed using a material having low oxygen affinity.

An oxide semiconductor layer having an amorphous structure may be formed as the oxide semiconductor layer, and the amorphous structure may remain in a region other than the crystalline region (e.g., a region other than a channel formation region).

Note that the term such as "over" or "below" in this specification and the like does not necessarily mean that a component is placed "directly on" or "directly under" another component. For example, the expression "a gate electrode layer over a gate insulating layer" does not exclude the case where a component is placed between the gate insulating layer and the gate electrode layer. Moreover, the terms such as "over" and "below" are used only for convenience of description and can include the case where the vertical relation of components is reversed, unless otherwise specified In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

In an embodiment of the disclosed invention, a purified oxide semiconductor layer is used for a semiconductor device. The purification means at least one of removing hydrogen, which causes an oxide semiconductor to change to an n-type oxide semiconductor, from the oxide semiconductor layer as much as possible and reducing defects, which are caused by oxygen deficiency in the oxide semiconductor layer, by supply of oxygen that the oxide semiconductor layer lacks.

The purification is conducted in order to obtain an intrinsic (i-type) oxide semiconductor layer. Since an oxide semiconductor generally has n-type conductivity, the off-state current is high. When the off-state current is high, switching characteristics are insufficient, which is not appropriate for semiconductor devices. Therefore, an oxide semiconductor layer is purified to change to an i-type or substantially i-type oxide semiconductor layer.

In an embodiment of the disclosed invention, an oxide semiconductor layer including a crystalline region is used in a semiconductor device.

Electrical characteristics are different between an oxide semiconductor layer including a crystalline region having electrical anisotropy and an oxide semiconductor layer without a crystalline region. For example, in an oxide semiconductor layer including a crystalline region having c-axis aligned in a direction substantially perpendicular to a surface of the oxide semiconductor layer, conductivity in a direction parallel to the surface of the oxide semiconductor layer is increased and an insulating property in a direction perpendicular to the surface of the oxide semiconductor layer is increased.

Thus, when the oxide semiconductor layer including a crystalline region is used for a semiconductor device, the semiconductor device can have excellent electrical characteristics.

BEST MODE FOR CARRYING OUT THE INVENTION

Figure 1A:
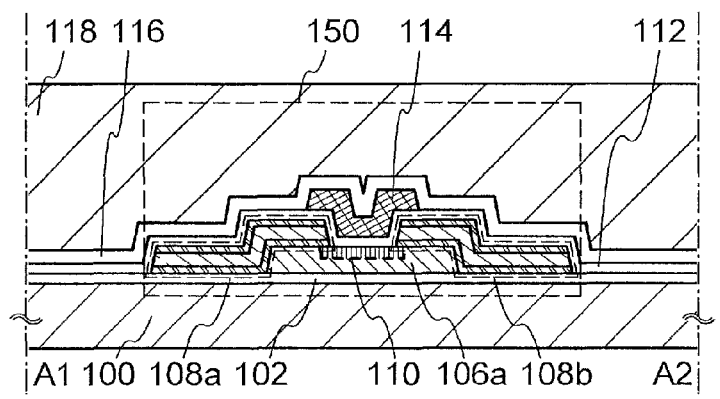
FIGS. 1A and 1B are cross-sectional views each illustrating a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a structure and a manufacturing method of a semiconductor device according to one embodiment of the disclosed invention will be described with reference to FIGS. 1A and 1B, FIG. 2, FIG. 3, FIGS. 4A and 4B, FIGS. 5 to 11, FIGS. 12A to 12D, FIGS. 13A to 13D, FIGS. 14A to 14C, FIGS. 15A to 15C, and FIG. 16.

<Structure of Semiconductor Device>

Figure 1B:
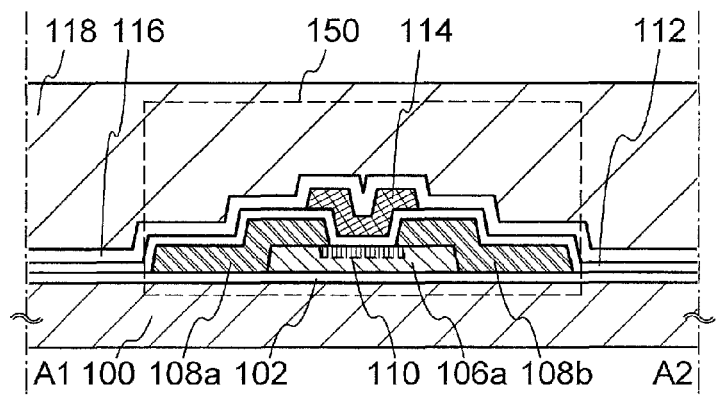

FIGS. 1A and 1B are cross-sectional views each illustrating a transistor 150 which is an example of a structure of a semiconductor device. Note that the transistor 150 is an n-channel transistor here; alternatively, a p-channel transistor may be used.

The transistor 150 includes an oxide semiconductor layer 106a provided over a substrate 100 with an insulating layer 102 interposed therebetween, a crystalline region 110 in the oxide semiconductor layer 106a, a source or drain electrode layer 108a and a source or drain electrode layer 108b electrically connected to the oxide semiconductor layer 106a, a gate insulating layer 112 covering the oxide semiconductor layer 106a, the source or drain electrode layer 108a, and the source or drain electrode layer 108b, and a gate electrode layer 114 over the gate insulating layer 112 (see FIGS. 1A and 1B). Here, FIG. 1A illustrates the case where the source or drain electrode layer 108a and the source or drain electrode layer 108b have a stacked structure, and FIG. 1B illustrates the case where the source or drain electrode layer 108a and the source or drain electrode layer 108b have a single-layer structure. Note that in the case of a single-layer structure, it is easy to realize a favorable tapered shape.

In addition, an interlayer insulating layer 116 and an interlayer insulating layer 118 are provided over the transistor 150. Note that the interlayer insulating layer 116 and the interlayer insulating layer 118 are not essential components and therefore may be omitted as appropriate.

For the oxide semiconductor layer 106a, any of the following materials is used: four-component metal oxide such as an In—Sn—Ga—Zn—O-based material; three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxide such as an In—Zn—O-based material, a Sn—Zn—O-based material, an Al—Zn—O-based material, a Zn—Mg—O-based material, a Sn—Mg—O-based material, and an In—Mg—O-based material; single-component metal oxide such as an In—O-based material, a Sn—O-based material, and a Zn—O-based material; and the like.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

The oxide semiconductor layer 106a is preferably an oxide semiconductor layer which is purified by sufficiently removing an impurity such as hydrogen therefrom and supplying oxygen thereto. Specifically, the hydrogen concentration of the oxide semiconductor layer 106a is $5 \times 10^{19}/cm^3$ or less, preferably $5 \times 10^{18}/cm^3$ or less, more preferably $5 \times 10^{17}/cm^3$ or less. Note that the oxide semiconductor layer 106a which is purified by sufficiently reducing hydrogen concentration and supplying oxygen has a carrier density (e.g., less than $1 \times 10^{12}/cm^3$, preferably less than $1.45 \times 10^{10}/cm^3$) which is sufficiently lower than that of silicon to which an impurity element is added (approximately $1 \times 10^{14}/cm^3$). The transistor 150 with excellent off-state current characteristics can be obtained with the use of such an i-type or substantially i-type oxide semiconductor. For example, when the drain voltage $V_D$ is +1 V or +10 V and the gate voltage $V_G$ is set in the range of from −5 V to −20 V, the off-state current is $1\times10^{-13}$ A or less. Note that the above hydrogen concentration of the oxide semiconductor layer 106a is measured by secondary ion mass spectrometry (SIMS).

Here, the oxide semiconductor layer 106a includes the crystalline region 110. The region corresponds to a region including a surface of the oxide semiconductor layer 106a, in other words, a region including a portion in contact with the gate insulating layer 112.

The crystalline region 110 preferably includes a crystal whose c-axis is aligned in a direction substantially perpendicular to the surface of the oxide semiconductor layer 106a. For example, the crystalline region 110 may be a region including a crystal grain whose c-axis is aligned in a direction substantially perpendicular to the surface of the oxide semiconductor layer 106a. Here, "substantially perpendicular" means being within ±10° from a perpendicular direction. Note that the crystalline region 110 may be formed only in the vicinity of the surface of the oxide semiconductor layer 106a (e.g., a region extending from the surface to a distance (depth) of 10 nm or less) or may be formed to reach the rear surface of the oxide semiconductor layer 106a.

In addition, the crystalline region 110 preferably includes a plate-like crystal. Here, the plate-like crystal means a crystal that is grown in a planar manner and has a shape like a thin plate. In addition, the thickness of the crystalline region is preferably 2 nm to 10 nm.

Note that the oxide semiconductor layer 106a may have any of an amorphous structure and non-single-crystal structures (including a microcrystalline structure, a polycrystalline structure, and the like) including the above material. On the other hand, the crystalline region 110 preferably has a non-single-crystal structure or the like. It is preferable that at least the crystalline region 110 have higher crystallinity than the other region in the oxide semiconductor layer 106a.

By including the crystalline region 110 as described above, the oxide semiconductor layer 106a can have electrical anisotropy.

Note that the surface of the oxide semiconductor layer 106a preferably has at least a predetermined degree of planarity in a channel formation region (a region overlapping with the gate electrode layer). For example, the difference in height of the surface of the oxide semiconductor layer 106a is 1 nm or less (preferably, 0.2 nm or less) in the channel formation region. When the crystalline region 110 of the oxide semiconductor layer 106a is formed with a polycrystal or the like, in some cases, adjacent crystal grains do not have identical a-b planes. In other words, in some cases, there is a difference between layers parallel to the a-axis and the b-axis of crystal grains. Such a difference may cause a decrease in electrical conductivity. Therefore, in the channel formation region, layers parallel to the a-axis and the b-axis are preferably identical.

As described above, with the use of the oxide semiconductor layer 106a which is purified and includes the crystalline region 110, a semiconductor device having favorable electrical characteristics can be realized.

In addition, the crystalline region 110 is stable as compared to the other region in the oxide semiconductor layer 106a, and thus can prevent entry of an impurity (e.g., moisture or the like) into the oxide semiconductor layer 106a. Therefore, the reliability of the oxide semiconductor layer 106a can be improved. In addition, because the crystalline region 110 is stable as compared to the other region in the oxide semiconductor layer 106a, with the use of this portion as a channel formation region, stable transistor characteristics can be obtained.

Hereinafter, the meaning of purification of an oxide semiconductor to cause the oxide semiconductor to be an intrinsic (i-type) oxide semiconductor, an advantage of using an oxide semiconductor in a semiconductor device, and the like will be briefly described.

<Realization of Intrinsic Oxide Semiconductor>

Considerable research has been done on properties of oxide semiconductors, such as the density of states (DOS); however, the research does not include the idea of sufficiently reducing defective states themselves. According to an embodiment of the disclosed invention, a purified, intrinsic (i-type) oxide semiconductor is manufactured by removing water or hydrogen, which might be a cause of an increase in the DOS, from the oxide semiconductor. This is based on the idea of sufficiently reducing the DOS itself. Thus, excellent industrial products can be manufactured.

Note that oxygen may be removed while hydrogen, water, or the like is being removed. Therefore, it is preferable to realize a further purified, intrinsic (i-type) oxide semiconductor in such a manner that oxygen is supplied to metal dangling bonds generated by oxygen deficiency so that the DOS due to oxygen deficiency is reduced. For example, an oxygen-excess oxide film is formed in close contact with a channel formation region and heat treatment is performed at a temperature of approximately 200° C. to 400° C., typically 250° C., whereby oxygen can be supplied from the oxide film and the DOS due to oxygen deficiency can be reduced. An inert gas may be switched to a gas including oxygen during the first to third heat treatments to be described below. Further, after the first to third heat treatments, oxygen can be supplied to the oxide semiconductor through a temperature decreasing process in an oxygen atmosphere or an atmosphere in which hydrogen, water, or the like is sufficiently reduced.

It can be considered that a factor causing deterioration of characteristics of an oxide semiconductor is a shallow level due to excess hydrogen at 0.1 eV to 0.2 eV below the conduction band, a deep level due to oxygen deficiency, or the like. The technical idea that hydrogen is thoroughly eliminated and oxygen is adequately supplied in order to eliminate such a defect would be right.

An oxide semiconductor is generally considered as an n-type semiconductor; however, according to an embodiment of the disclosed invention, an i-type oxide semiconductor is realized by removing an impurity such as water or hydrogen and supplying oxygen which is a constituent element of the oxide semiconductor. In this respect, it can be said that an embodiment of the disclosed invention includes a novel technical idea because it is not an i-type semiconductor such as silicon which is obtained by adding an impurity element.

<Advantage in Process Over Other Semiconductor Materials>

As a semiconductor material that can be compared to an oxide semiconductor, silicon carbide (e.g., 4H—SiC) or the like can be given. An oxide semiconductor and 4H—SiC have some common features. The carrier density is one example thereof. In accordance with Fermi-Dirac distribution, the density of minority carriers in an oxide semiconductor is estimated to be approximately $10^{-7}/cm^3$. This value of the minority carrier density is extremely small in a manner similar to that of 4H—SiC, which is $6.7\times10^{-11}/cm^3$. In comparison with the intrinsic carrier density of silicon (approximately $1.45\times10^{10}/cm^3$), it can be well understood that the degree is significantly low.

In addition, the energy band gap of the oxide semiconductor is 3.0 eV to 3.5 eV, and the energy band gap of 4H—SiC is 3.26 eV. Therefore, an oxide semiconductor and silicon carbide are similar in that they are both wide bandgap semiconductors.

On the other hand, there is a significant difference between an oxide semiconductor and silicon carbide, that is, the process temperature. In general, heat treatment at 1500° C. to 2000° C. is required when using silicon carbide. At such a high temperature, a semiconductor substrate, a semiconductor element, or the like is damaged, and thus, it is difficult to form a semiconductor element using silicon carbide over a semiconductor element using a semiconductor material other than silicon carbide. On the other hand, an oxide semiconductor can be obtained through heat treatment at 850° C. or lower, preferably 750° C. or lower. Therefore, it is possible to form a semiconductor element using an oxide semiconductor after forming an integrated circuit using another semiconductor material.

In the case of using an oxide semiconductor, there is an advantage that it is possible to use a substrate having low heat resistance such as a glass substrate, which is different from the case where silicon carbide is used. Moreover, there is also an advantage that high-temperature heat treatment is not required so that energy cost can be reduced sufficiently as compared to silicon carbide. Further, in silicon carbide, a crystal defect or a small amount of impurities which is introduced into the silicon carbide without intention is a factor causing carriers to be generated. In theory, a low carrier density equivalent to that of the oxide semiconductor of the present invention can be obtained in the case of silicon carbide; however, it is practically difficult to obtain a carrier density less than $10^{12}/cm^3$ for the reasons given above. The same applies to a comparison between the oxide semiconductor and gallium nitride which is also known as a wide bandgap semiconductor.

<Electrical Conduction Mechanism of Transistor Including Oxide Semiconductor>

An electrical conduction mechanism of a transistor including an oxide semiconductor will be described with reference to FIG. 2, FIG. 3, FIGS. 4A and 4B, and FIG. 5. Note that the following description is based on the assumption of an ideal situation for easy understanding and does not necessarily reflect a real situation. Note also that the following description is just a consideration.

Figure 2:
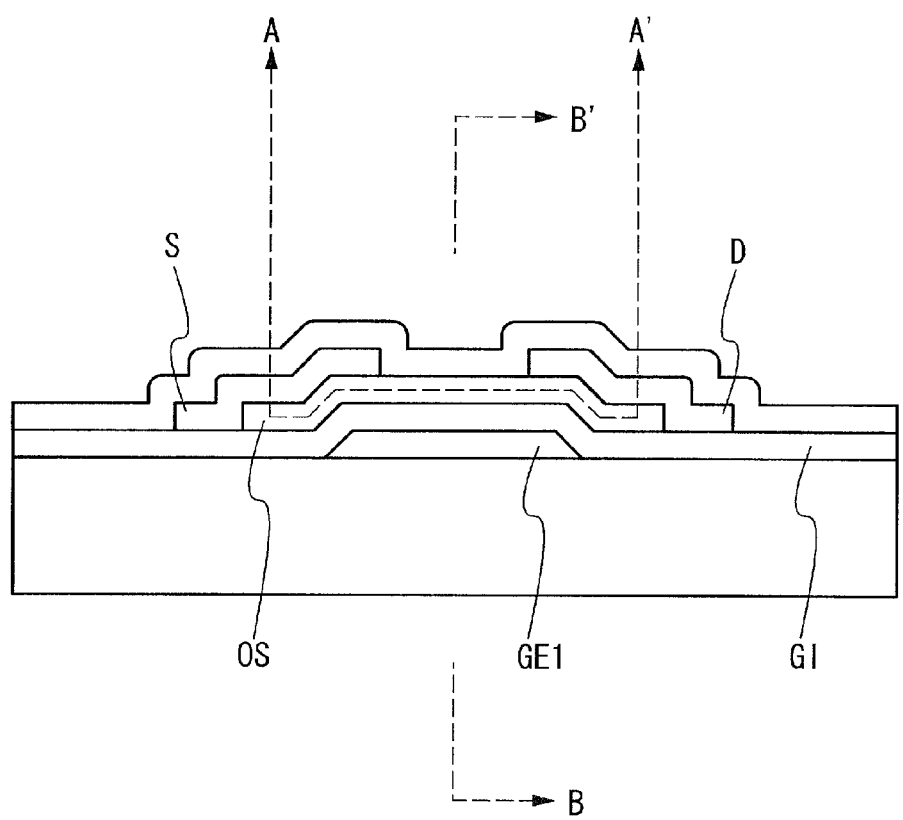
FIG. 2 is a cross-sectional view of a transistor including an oxide semiconductor.

FIG. 2 is a cross-sectional view of a transistor (thin film transistor) including an oxide semiconductor. An oxide semiconductor layer (OS) is provided over a gate electrode (GE1) with a gate insulating layer (GI) interposed therebetween. A source electrode (S) and a drain electrode (D) are provided thereover. An insulating layer is provided so as to cover the source electrode (S) and the drain electrode (D).

Figure 3:
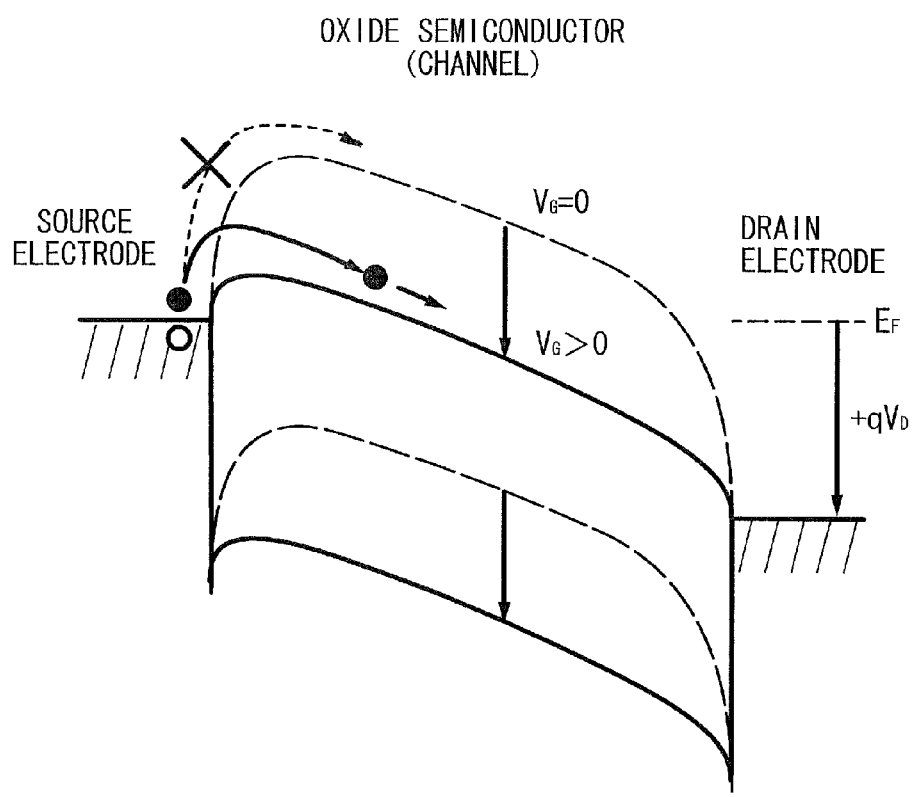
FIG. 3 is an energy band diagram (schematic diagram) of an A-A' section in FIG. 2.

FIG. 3 is an energy band diagram (schematic diagram) of the A-A' section in FIG. 2. In FIG. 3, a black circle (●) and a white circle (○) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 4A:
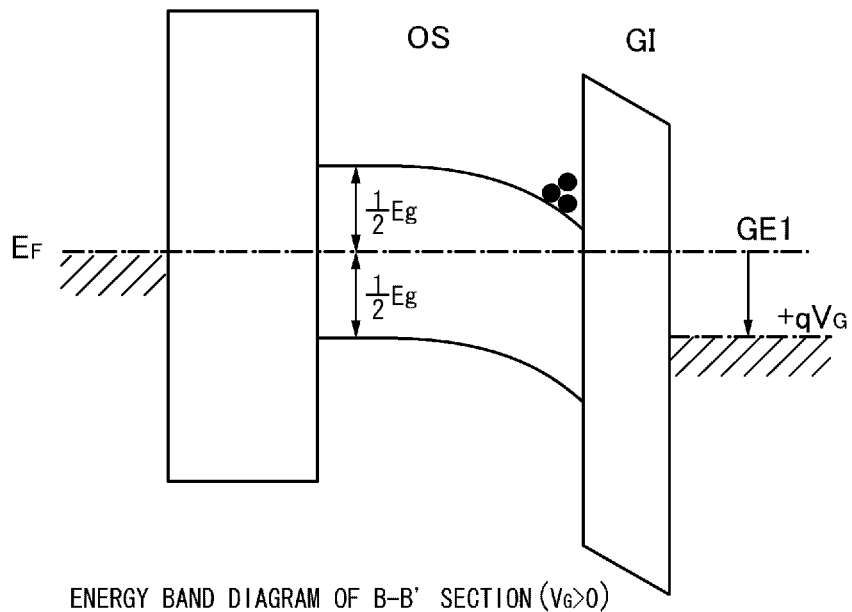
FIG. 4A illustrates a state in which a positive voltage ($V_G$>0) is applied to a gate (GE1)
Figure 4B:
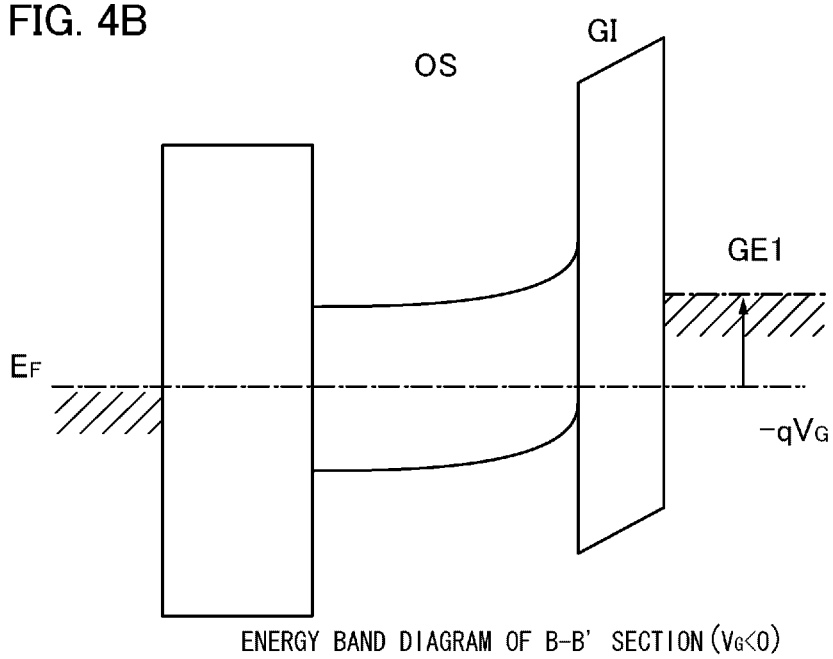
FIG. 4B illustrates a state in which a negative voltage ($V_G$<0) is applied to the gate (GE1).

FIGS. 4A and 4B are energy band diagrams (schematic diagrams) of the B-B' section in FIG. 2. FIG. 4A illustrates an on state in which a positive voltage ($V_G>0$) is applied to the gate electrode (GE1) and carriers (electrons) flow between the source electrode and the drain electrode. FIG. 4B illustrates an off state in which a negative voltage ($V_G<0$) is applied to the gate electrode (GE1) and minority carriers do not flow.

Figure 5:
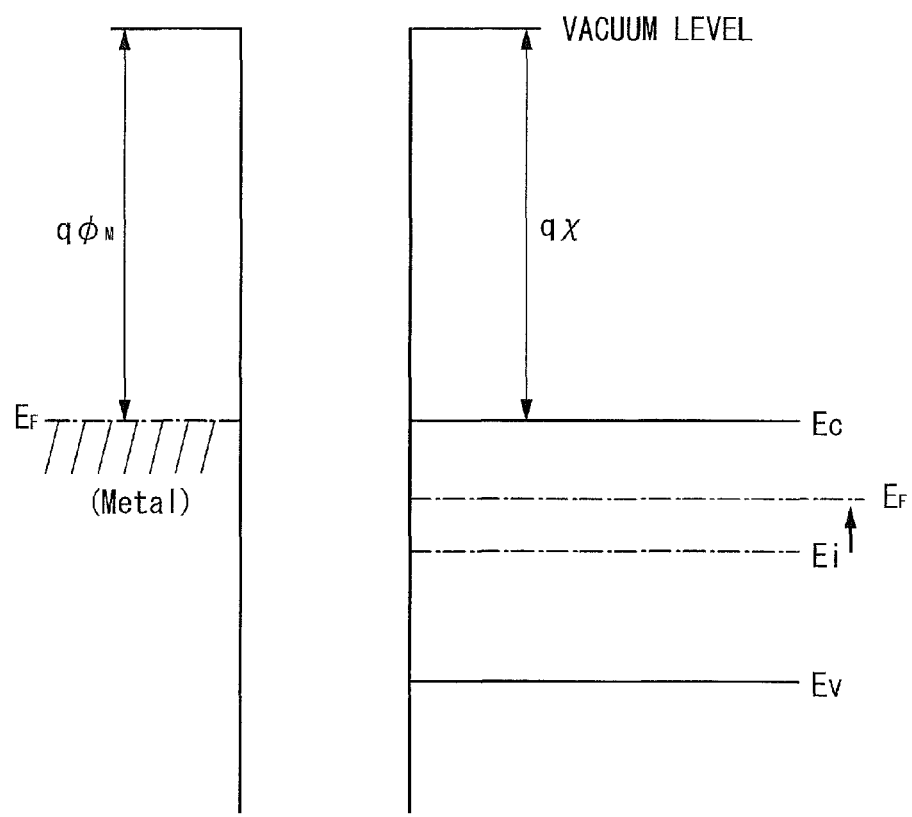
FIG. 5 is a diagram illustrating the relationships between the vacuum level and the work function of a metal ($\phi_m$) and between the vacuum level and the electron affinity ($\chi$) of an oxide semiconductor.

FIG. 5 illustrates the relationships between the vacuum level and the work function of a metal ($\phi_m$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type oxide semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type oxide semiconductor.

On the other hand, an oxide semiconductor according to one embodiment of the disclosed invention is an intrinsic (i-type) or substantially intrinsic oxide semiconductor which is obtained by removing hydrogen that is a factor for an n-type oxide semiconductor from an oxide semiconductor, and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 4A.

In addition, as illustrated in FIG. 4B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of 1×10⁴ μm and a channel length (L) of 3 μm, for example, it is possible to realize characteristics such as an off-state current of $10^{-13}$ A or less and a subthreshold swing (S value) of 0.1 V/dec (with a 100 nm thick gate insulating layer).

The oxide semiconductor is purified as described above so as to contain an element other than its main element (i.e., an impurity element) as little as possible, so that the thin film transistor can operate in a favorable manner.

<Resistance of Transistor Including Oxide Semiconductor to Hot Carrier Degradation>

Next, the resistance of a transistor including an oxide semiconductor to hot carrier degradation will be described with reference to FIG. 6 and FIG. 7. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer in a semiconductor layer are injected into the gate insulating layer or the like. Electrons gain energy by being accelerated by a low electric field.

DAHC injection refers to a phenomenon in which electrons generated by collision of electrons accelerated by a high electric field are injected to a gate insulating layer or the like. A difference between DAHC injection and CHE injection is whether or not they involve avalanche breakdown caused by impact ionization. Note that DAHC injection requires electrons having a kinetic energy higher than or equal to a band gap of a semiconductor.

Figure 6:
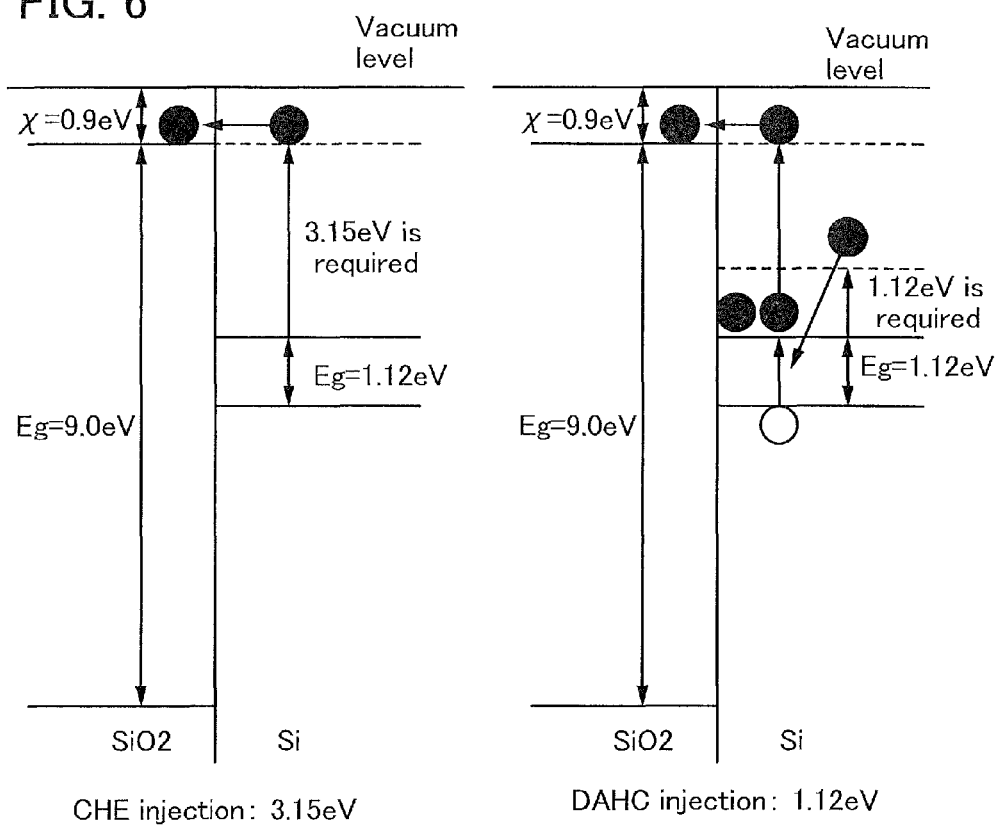
FIG. 6 illustrates energy required for hot carrier injection in silicon (Si).
Figure 7:
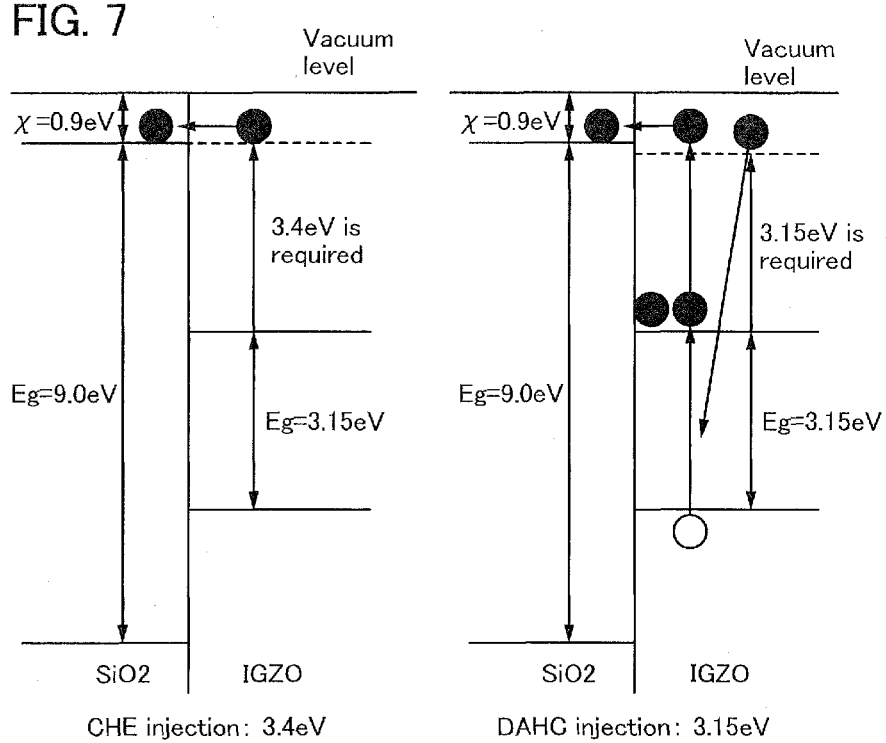
FIG. 7 illustrates energy required for hot carrier injection in an In—Ga—Zn—O-based oxide semiconductor (IGZO).

FIG. 6 and FIG. 7 illustrate energy required for each hot carrier injection which is estimated from the band structure of silicon (Si) and an In—Ga—Zn—O-based oxide semiconductor (IGZO). FIG. 6 and FIG. 7 show CHE injection on the left side and DAHC injection on the right side.

Regarding silicon, degradation caused by DAHC injection is more serious than that caused by CHE injection. This results from the fact that silicon has a narrow band gap and avalanche breakdown readily occurs therein. Because carriers (e.g., electrons) which are accelerated without colliding are very few in silicon, the probability of CHE injection is therefore low. On the other hand, avalanche breakdown increases the number of electrons capable of travelling over the barrier of the gate insulating layer, and this increases the number of electrons injected to the gate insulating layer.

Regarding an In—Ga—Zn—O-based oxide semiconductor, the energy required for CHE injection does not greatly differ from that in the case of silicon, and the energy required for DAHC injection is substantially equal to the energy required for CHE injection due to a wide band gap. In other words, the probability of DAHC injection is low.

On the other hand, like silicon, carriers (e.g., electrons) which are accelerated without colliding are very few, and the probability of CHE injection is therefore also low. In other words, an In—Ga—Zn—O-based oxide semiconductor has higher resistance to hot carrier degradation than silicon.

<Short-Channel Effect in Transistor Including Oxide Semiconductor>

Next, a short-channel effect in a transistor including an oxide semiconductor will be described with reference to FIG. 8 and FIG. 9. Note that the following description is based on the assumption of an ideal situation for easy understanding and does not necessarily reflect a real situation. Note also that the following description is just a consideration.

The short-channel effect refers to degradation of electrical characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier density and a different thickness of an oxide semiconductor layer were prepared, and the relationship between a channel length (L) and a threshold voltage ($V_{th}$) was checked. As the models, bottom-gate transistors were employed, in each of which the carrier density was $1.7 \times 10^{-8}/cm^3$ or $1.0 \times 10^{15}/cm^3$ and an oxide semiconductor layer had a thickness of 1 μm or 30 nm. Note that an In—Ga—Zn—O-based oxide semiconductor was used for the oxide semiconductor layer, and a silicon oxynitride film with a thickness of 100 nm was used as a gate insulating layer.

Note that there is no significant difference in calculation results between a top-gate transistor and a bottom-gate transistor.

Figure 8:
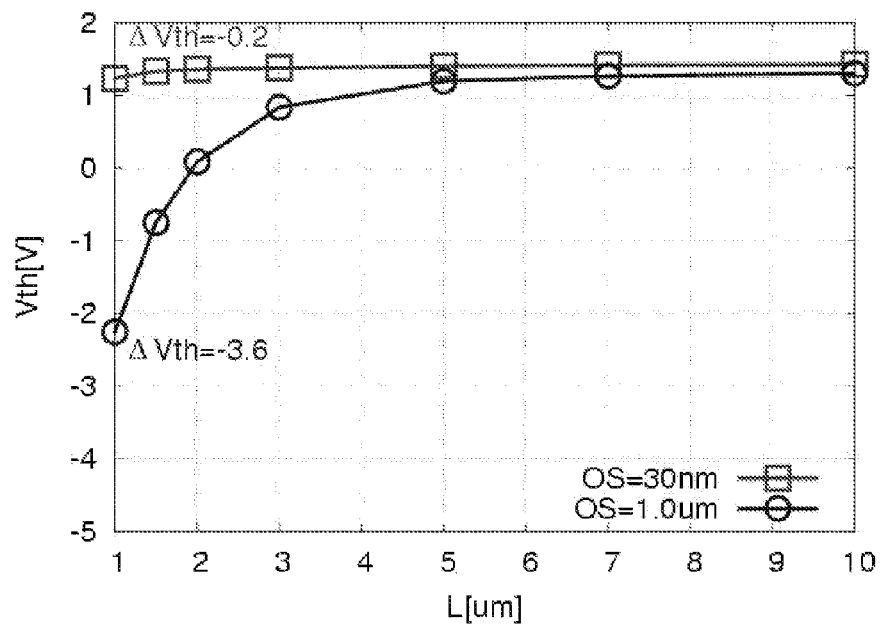
FIG. 8 shows results of device simulation as to the short-channel effect.
Figure 9:
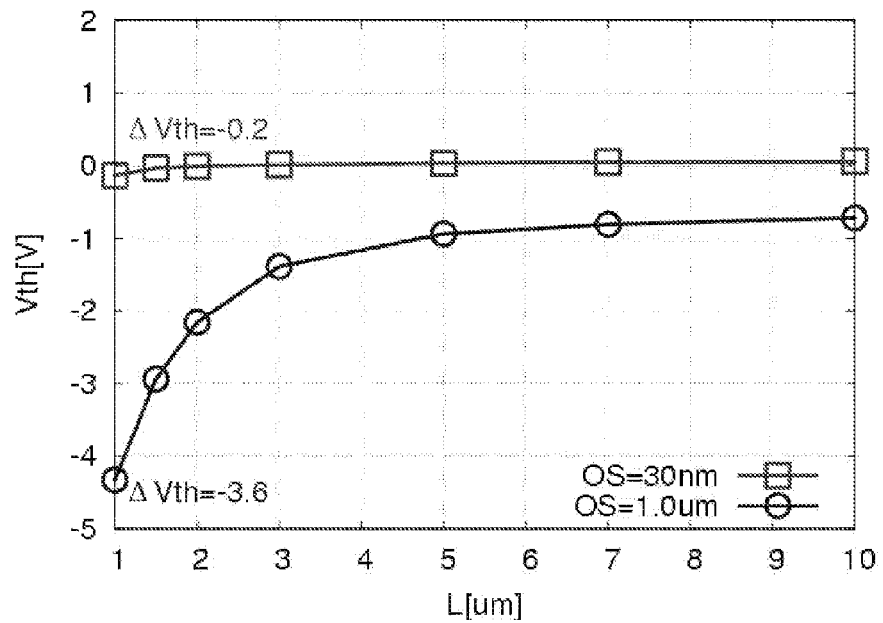
FIG. 9 shows results of device simulation as to the short-channel effect.

FIG. 8 and FIG. 9 show calculation results. FIG. 8 shows the case where the carrier density is $1.7 \times 10^{-8}/cm^3$ and FIG. 9 shows the case where the carrier density is $1.0 \times 10^{15}/cm^3$. The results show that a short-channel effect can be suppressed in a transistor including an oxide semiconductor by a reduction in thickness of an oxide semiconductor layer. For example, in the case where the channel length is approximately 1 μm, even with an oxide semiconductor layer having sufficiently low carrier density, it can be understood that a short-channel effect can be sufficiently suppressed when the thickness of the oxide semiconductor layer is set to approximately 3 nm to 50 nm, preferably, 3 nm to 20 nm.

<Carrier Density of Oxide Semiconductor>

A technical idea according to the disclosed invention is to make an oxide semiconductor layer as close as possible to an intrinsic (i-type) oxide semiconductor layer by sufficiently reducing the carrier density thereof. A method for calculating the carrier density and an actually measured carrier density of an oxide semiconductor layer will be described with reference to FIG. 10 and FIG. 11.

The carrier density of an oxide semiconductor layer can be obtained in such a manner that a MOS capacitor including an oxide semiconductor layer is manufactured and the results of C-V (capacitance-voltage) measurement (C-V characteristics) of the MOS capacitor are evaluated.

The carrier density is measured according to the following steps (1) to (3): (1) to obtain C-V characteristics by plotting the relation between the gate voltage $V_g$ and capacitance C of the MOS capacitor; (2) to obtain a graph showing the relation between the gate voltage $V_g$ and $(1/C)^2$ with the use of the C-V characteristics, and to obtain a differential value of $(1/C)^2$ in a weak inversion region in the graph; and (3) to substitute the differential value obtained into Formula 1, which is shown below, representing the carrier density ($N_d$). Note that e, $\epsilon_0$, and $\epsilon$ in Formula 1 represent elementary electric charge, vacuum permittivity, and relative permittivity of an oxide semiconductor, respectively.

$$N_d = \frac{-\left(\frac{2}{e\varepsilon_0\varepsilon}\right)}{\frac{d(1/C)^2}{dV}}$$ [Formula 1]

As a sample used for the measurement, a MOS capacitor having the following structure was used. The MOS capacitor includes a 300 nm thick titanium layer over a glass substrate, a 100 nm thick titanium nitride layer over the titanium layer, a 2 µm thick oxide semiconductor layer including an In—Ga—Zn—O-based oxide semiconductor (a-IGZO) over the titanium nitride layer, a 300 nm thick silicon oxynitride layer over the oxide semiconductor layer, and a 300 nm thick silver layer over the silicon oxynitride layer.

Note that the oxide semiconductor layer was formed using a target for depositing an oxide semiconductor including In, Ga, and Zn (In:Ga:Zn=1:1:0.5 [atomic ratio]) by a sputtering method. Further, an atmosphere in which the oxide semiconductor layer was formed was a mixed atmosphere of argon and oxygen (with a flow ratio of Ar:$O_2$=30 (sccm):15 (sccm)).

Figure 10:
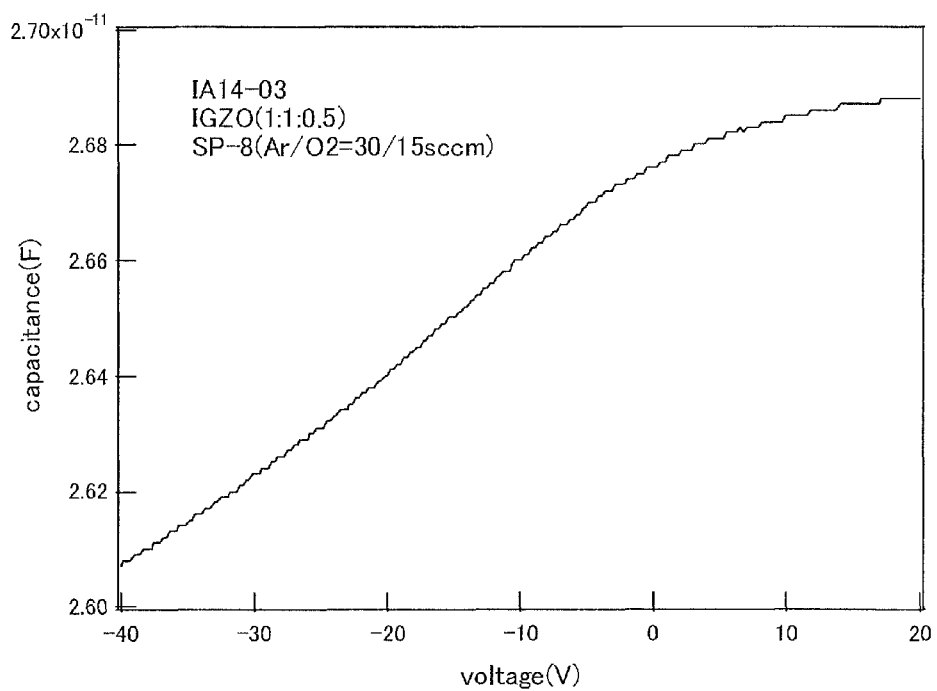
FIG. 10 shows C-V (capacitance-voltage) characteristics.
Figure 11:
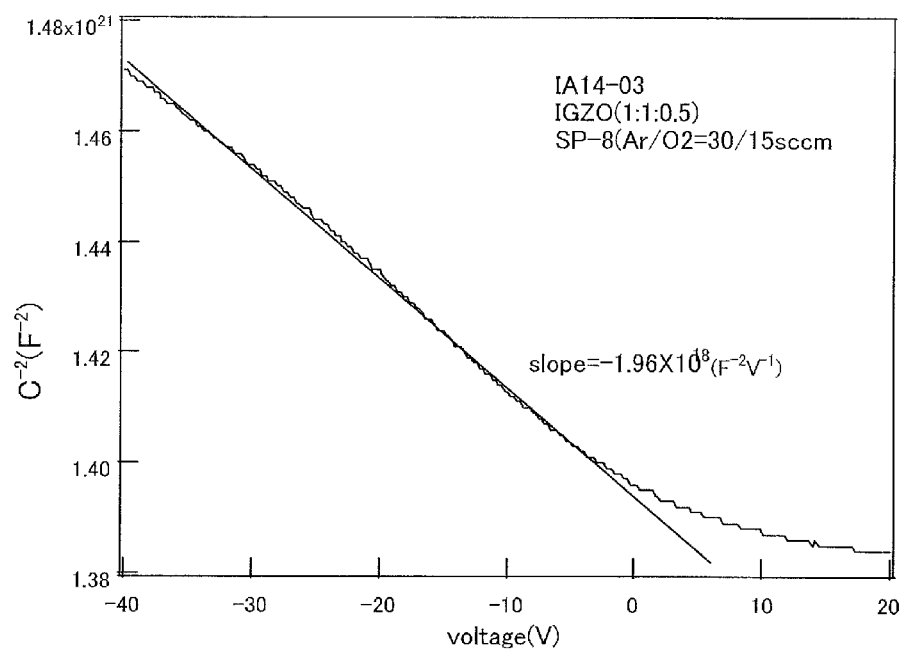
FIG. 11 shows the relationship between $V_G$ and $(1/C)^2$.

FIG. 10 and FIG. 11 show the C-V characteristics and the relationship between $V_g$ and $(1/C)^2$, respectively. The carrier density calculated using Formula 1 from the differential value of $(1/C)^2$ in a weak inversion region of the graph of FIG. 11 was $6.0 \times 10^{10}/cm^3$.

In this manner, by using an i-type or substantially i-type oxide semiconductor (for example, with a carrier density of less than $1 \times 10^{12}/cm^3$, preferably less than $1.45 \times 10^{10}/cm^3$), a transistor with excellent off-state current characteristics can be obtained.

As described above, it can be understood that a variety of advantageous effects can be obtained when an oxide semiconductor, particularly, a purified intrinsic oxide semiconductor is used. In addition, when an intrinsic oxide semiconductor layer having a crystalline structure is realized as in the disclosed invention, a novel semiconductor device having excellent characteristics is realized.

<Manufacturing Method of Semiconductor Device>

Next, a manufacturing method of the transistor 150 which is an example of a structure of a semiconductor device will be described with reference to FIGS. 12A to 12D and FIGS. 13A to 13D.

First, the insulating layer 102 is formed over the substrate 100. Then, an oxide semiconductor layer 106 is formed over the insulating layer 102 (see FIG. 12A).

The substrate 100 may be any substrate that has an insulating surface and may be, for example, a glass substrate. The glass substrate is preferably a non-alkali glass substrate. As a material of the non-alkali glass substrate, a glass material such as aluminosilicate glass, aluminoborosilicate glass, barium borosilicate glass, or the like is used, for example. Alternatively, as the substrate 100, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used.

The insulating layer 102 functions as a base and can be formed by a CVD method, a sputtering method, or the like. The insulating layer 102 is preferably formed so as to include silicon oxide, silicon nitride, silicon oxynitride, silicon nitride oxide, aluminum oxide, hafnium oxide, tantalum oxide, or the like. Note that the insulating layer 102 may have a single-layer structure or a stacked structure. There is no particular limitation on the thickness of the insulating layer 102; the insulating layer 102 can have a thickness of 10 nm to 500 nm, for example. Here, the insulating layer 102 is not an essential component; therefore, a structure in which the insulating layer 102 is not provided is also possible.

If hydrogen, water, or the like is contained in the insulating layer 102, hydrogen may enter the oxide semiconductor layer or extract oxygen from the oxide semiconductor layer, whereby characteristics of the transistor may be degraded. Therefore, it is desirable to form the insulating layer 102 so as to include as little hydrogen or water as possible.

In the case of using a sputtering method or the like, for example, it is desirable that the insulating layer 102 be formed in a state where moisture remaining in the treatment chamber is removed. In order to remove moisture remaining in the treatment chamber, an entrapment vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the insulating layer 102 can be reduced.

When the insulating layer 102 is formed, it is desirable to use a high-purity gas in which an impurity such as hydrogen or water is reduced to a concentration of approximately several parts per million (preferably several parts per billion).

The oxide semiconductor layer 106 can be formed using any of the following materials: four-component metal oxide such as an In—Sn—Ga—Zn—O-based material; three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxide such as an In—Zn—O-based material, a Sn—Zn—O-based material, an Al—Zn—O-based material, a Zn—Mg—O-based material, a Sn—Mg—O-based material, and an In—Mg—O-based material; single-component metal oxide such as an In—O-based material, a Sn—O-based material, and a Zn—O-based material; and the like.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

In this embodiment, as the oxide semiconductor layer 106, an amorphous oxide semiconductor layer is formed by a sputtering method using a target for depositing an In—Ga—Zn—O-based oxide semiconductor.

As a target used for forming the oxide semiconductor layer 106 by a sputtering method, a metal oxide target containing zinc oxide as its main component can be used, for example.

Furthermore, a target for depositing an oxide semiconductor including In, Ga, and Zn has a composition ratio of In:Ga:Zn=1:x:y (x is greater than or equal to 0 and less than or equal to 2, and y is greater than or equal to 1 and less than or equal to 5). For example, a target having a composition ratio of In:Ga:Zn=1:1:1 [atomic ratio] (x=1, y=1) or a composition ratio of $In_2O_3$:$Ga_2O_3$:ZnO=1:1:2 [molar ratio]) may be used. Furthermore, as a target for depositing an oxide semiconductor, a target having a composition ratio of In:Ga:Zn=1:1:0.5 [atomic ratio] or a composition ratio of In:Ga:Zn=1:1:2 [atomic ratio] or In:Ga:Zn=1:0:1 [atomic ratio] (x=0, y=1) may be used. In this embodiment, heat treatment is performed later in order to intentionally crystallize an oxide semiconductor layer; thus, a target for depositing an oxide semiconductor with which an oxide semiconductor layer which can easily be crystallized is preferably used.

The relative density of an oxide semiconductor in a target for depositing an oxide semiconductor is 80% or more, preferably 95% or more, more preferably 99.9% or more. The use of a target for depositing an oxide semiconductor having high relative density makes it possible to form an oxide semiconductor layer with a dense structure.

The atmosphere in which the oxide semiconductor layer 106 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which an impurity such as hydrogen, water, a hydroxyl group, or hydride is removed to a concentration of approximately several parts per million (preferably, several parts per billion).

In forming the oxide semiconductor layer 106, for example, the substrate is held in a treatment chamber that is maintained under reduced pressure, and the substrate is heated to a temperature of 100° C. to 600° C., preferably 200° C. to 400° C. Then, a sputtering gas from which hydrogen and water are removed is introduced into the treatment chamber from which remaining moisture is removed, and the oxide semiconductor layer 106 is formed using metal oxide as a target. By forming the oxide semiconductor layer 106 while heating the substrate, an impurity in the oxide semiconductor layer 106 can be reduced. Moreover, damage due to sputtering is reduced. In order to remove moisture remaining in the treatment chamber, an entrapment vacuum pump is preferably used. For example, a cryopump, an ion pump, a titanium sublimation pump, or the like can be used. A turbo pump provided with a cold trap may be used. From the treatment chamber evacuated with a cryopump or the like, hydrogen, water, or the like is sufficiently removed; therefore, the concentration of an impurity in the oxide semiconductor layer 106 can be reduced.

For example, the conditions for forming the oxide semiconductor layer 106 can be set as follows: the distance between the substrate and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (powder or flake-like substances formed at the time of the film formation) can be reduced and the film thickness can be uniform. The thickness of the oxide semiconductor layer 106 is set in the range of 2 nm to 200 nm, preferably 5 nm to 30 nm. Note that the appropriate thickness of the oxide semiconductor layer 106 differs depending on the oxide semiconductor material to be used, the intended use, or the like; therefore, the thickness may be determined as appropriate in accordance with the material, the intended use, or the like.

Note that before the oxide semiconductor layer 106 is formed by a sputtering method, reverse sputtering in which plasma is generated with an argon gas introduced is preferably performed so that a material attached to the surface of the insulating layer 102 is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface side in an argon atmosphere so that plasma is generated near a substrate. Note that an atmosphere of nitrogen, helium, oxygen, or the like may be used instead of an argon atmosphere.

Figure 12A:
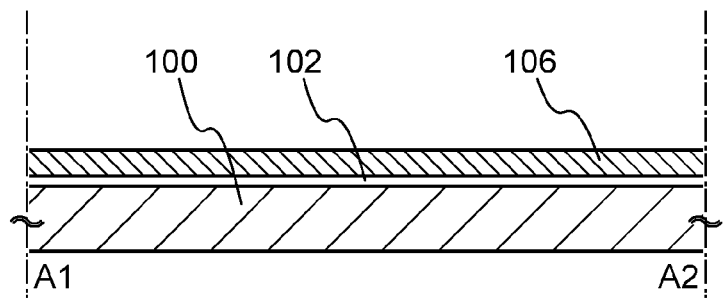
FIGS. 12A to 12D are cross-sectional views illustrating a manufacturing process of a semiconductor device.
Figure 12B:
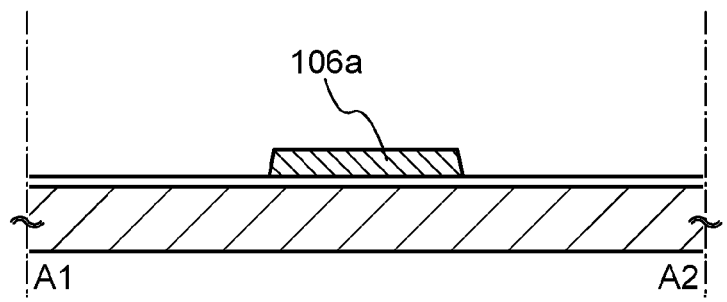

Next, the oxide semiconductor layer 106 is processed by a method such as etching using a mask; thus, the oxide semiconductor layer 106a having an island shape is formed (see FIG. 12B).

As a method for etching the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

As dry etching, a parallel plate reactive ion etching (RIE) method, an inductively coupled plasma (ICP) etching method, or the like can be used. Also in this case, etching conditions (e.g., the amount of electric power applied to a coiled electrode, the amount of electric power applied to an electrode on the substrate side, and the electrode temperature on the substrate side) need to be set as appropriate.

An example of an etching gas which can be used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

An example of an etchant which can be used for wet etching includes a mixed solution of phosphoric acid, acetic acid, and nitric acid, an ammonia hydrogen peroxide mixture (hydrogen peroxide solution of 31 wt %:ammonia solution of 28 wt %:water=5:2:2), or the like. An etchant such as ITO-07N (produced by KANTO CHEMICAL CO., INC.) may also be used.

After that, heat treatment (first heat treatment) is preferably performed on the oxide semiconductor layer 106a. Water (including a hydroxyl group), hydrogen, or the like contained in the oxide semiconductor layer 106a can be removed by the first heat treatment. For example, the temperature of the first heat treatment can be set higher than or equal to 300° C. and lower than 550° C., preferably higher than or equal to 400° C. and lower than 550° C. Note that the first heat treatment may double as second heat treatment (heat treatment for forming a crystalline region) to be performed later. In that case, the temperature of the heat treatment is preferably set higher than or equal to 550° C. and lower than or equal to 850° C.

For example, after the substrate 100 is introduced into an electric furnace including a resistance heater or the like, the heat treatment can be performed at 450° C. for one hour in a nitrogen atmosphere. The oxide semiconductor layer 106a is not exposed to the air during the heat treatment so that entry of water or hydrogen can be prevented.

The heat treatment apparatus is not limited to the electric furnace and can be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The substrate is put in an inert gas atmosphere that has been heated to a high temperature of 650° C. to 700° C., heated for several minutes, and taken out of the inert gas atmosphere. The GRTA treatment enables high-temperature heat treatment in a short time. Moreover, the GRTA treatment can be employed even when the temperature exceeds the upper temperature limit of the substrate because the heat treatment can be achieved in a short time. In the case where a glass substrate is used, shrinkage of the substrate becomes a problem at a temperature higher than the upper temperature limit (strain point) but does not in the case of performing heat treatment in a short time. Note that the inert gas may be switched to a gas including oxygen during the treatment. This is because defects caused by oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, the transistor 150 with extremely excellent characteristics can be obtained with the use of the oxide semiconductor layer 106a which is an i-type or substantially i-type oxide semiconductor layer obtained by removing an impurity through the first heat treatment.

Note that the first heat treatment can be performed on the oxide semiconductor layer 106 that has not yet been processed into the oxide semiconductor layer 106a having an island shape. In that case, after the first heat treatment, the substrate 100 is taken out of the heating apparatus and a photolithography step is performed.

The first heat treatment can also be referred to as dehydration treatment, dehydrogenation treatment, or the like because it has the effect of removing hydrogen or water. The dehydration treatment or dehydrogenation treatment can be performed after the oxide semiconductor layer is formed, after a source electrode layer and a drain electrode layer are stacked over the oxide semiconductor layer 106a, or after a gate insulating layer is formed over the source electrode layer and the drain electrode layer. Such dehydration treatment or dehydrogenation treatment may be performed once or plural times.

Figure 12C:
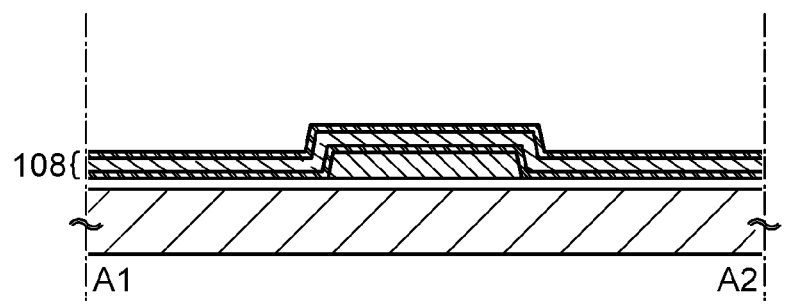

Next, a conductive layer 108 is formed so as to be in contact with the oxide semiconductor layer 106a (see FIG. 12C).

The conductive layer 108 can be formed by a PVD method such as a sputtering method, or a CVD method such as a plasma CVD method. The conductive layer 108 can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more elements selected from titanium, tantalum, tungsten, molybdenum, chromium, neodymium, and scandium may be used.

The conductive layer 108 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 108 may have a single-layer structure or a stacked structure including two or more layers. For example, the conductive layer 108 may have a three-layer structure in which an aluminum film is stacked over a titanium film and a titanium film is stacked over the aluminum film or a three-layer structure in which an aluminum film is stacked over a molybdenum film and a molybdenum film is stacked over the aluminum film. Alternatively, the conductive layer 108 can have a two-layer structure in which an aluminum film and a tungsten film are stacked, a two-layer structure in which a copper film and a tungsten film are stacked, or a two-layer structure in which an aluminum film and a molybdenum film are stacked. It is needless to say that the conductive layer 108 may have a single-layer structure or a stacked structure including four or more layers. In the case of a single-layer structure, a single-layer structure of a titanium film is preferable. With the use of a single-layer structure of a titanium film, later etching for forming a favorable tapered shape can be realized. Here, a three-layer structure of a titanium film, an aluminum film, and a titanium film is employed.

Note that a material having a low ability to extract oxygen (a material having low oxygen affinity) may be used in a portion of the conductive layer 108 which is in contact with the oxide semiconductor layer 106a. As such a material, titanium nitride, tungsten nitride, platinum, or the like can be given, for example. In a manner similar to the above, the conductive layer 108 may have either a single-layer structure or a stacked structure. In the case of the conductive layer 108 having a stacked structure, a two-layer structure of a titanium nitride film and a titanium film, a two-layer structure of a titanium nitride film and a tungsten film, a two-layer structure of a titanium nitride film and a copper-molybdenum alloy film, a two-layer structure of a tantalum nitride film and a tungsten film, a two-layer structure of a tantalum nitride film and a copper film, a three-layer structure of a titanium nitride film, a tungsten film, and a titanium film, or the like can be employed, for example.

In the case where the material having a low ability to extract oxygen as described above is used for the conductive layer 108, a change of the oxide semiconductor layer to an n-type due to extraction of oxygen can be prevented; accordingly, an adverse effect on transistor characteristics caused by an uneven change to an n-type or the like can be prevented.

In the case of using a material having a high barrier property, such as a titanium nitride film or a tantalum nitride film described above, in a portion of the conductive layer 108 which is in contact with the oxide semiconductor layer 106a, entry of an impurity into the oxide semiconductor layer 106a can be prevented and an adverse effect on transistor characteristics can be reduced.

Figure 12D:
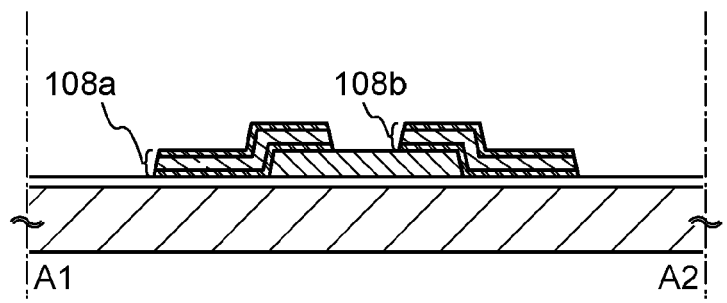

Next, the conductive layer 108 is selectively etched; thus, the source or drain electrode layer 108a and the source or drain electrode layer 108b are formed (see FIG. 12D). Note that an insulating layer may be formed over the conductive layer 108, and the insulating layer may be etched; thus, an insulating layer having substantially the same shape as the source or drain electrode layers may be formed over the source or drain electrode layers. In that case, capacitance between the source or drain electrode layers and the gate electrode layer (so-called gate capacitance) can be reduced. Note that the expression "substantially the same" or "substantially same" does not necessarily mean being exactly the same in a strict sense and can mean being considered as the same. For example, a difference made by a single etching process is acceptable. Further, the thickness does not need to be the same.

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light whose wavelength is several nanometers to several tens of nanometers, which is extremely short. In light exposure using extreme ultraviolet light, resolution is high and depth of focus is large. Therefore, the channel length (L) of a transistor which is formed later can also be made to be 10 nm to 1000 nm. By a decrease in channel length by such a method, operation speed can be improved. In addition, the off-state current of a transistor including the above-described oxide semiconductor is small; thus, an increase in power consumption due to miniaturization can be suppressed.

The materials and etching conditions of the conductive layer 108 and the oxide semiconductor layer 106a are adjusted as appropriate so that the oxide semiconductor layer 106a is not removed in etching of the conductive layer 108. Note that in some cases, the oxide semiconductor layer 106a is partly etched in the etching step and thus has a groove portion (a depression portion) depending on the materials and the etching conditions.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps. That is, a resist mask corresponding to at least two kinds of different patterns can be formed by using one multi-tone mask. Thus, the number of light-exposure masks can be reduced and the number of corresponding photolithography steps can also be reduced, whereby a process can be simplified.

Next, heat treatment (second heat treatment) is performed on the oxide semiconductor layer 106a. By the second heat treatment, the crystalline region 110 is formed in a region including a surface of the oxide semiconductor layer 106a (see FIG. 13A). Note that the range of the crystalline region 110 varies depending on the material of the oxide semiconductor layer 106a, the conditions of the heat treatment, and the like. For example, the crystalline region 110 can be formed to the lower interface of the oxide semiconductor layer 106a.

For the second heat treatment, heat treatment similar to the first heat treatment can be employed. In other words, heat treatment using an electric furnace, heat treatment using heat conduction from a medium such as a heated gas, heat treatment using thermal radiation, or the like can be employed.

Note that it is preferable that oxygen be not contained in a treatment atmosphere. This is because oxidation of the source or drain electrode layer 108a and the like can be prevented when oxygen is not contained in a treatment atmosphere. As a specific atmosphere, an inert gas (nitrogen, a rare gas, or the like) in which hydrogen, water, or the like is sufficiently reduced can be employed, for example. The temperature is set higher than or equal to 550° C. and lower than or equal to 850° C., preferably higher than or equal to 550° C. and lower than or equal to 750° C. This is because a favorable crystal can be grown by performing the second heat treatment at a relatively high temperature.

Note that although the essential part of the invention does not require a particular upper limit of the heat treatment temperature, in the case where the substrate 100 has low heat resistance, the upper limit of the heat treatment temperature needs to be lower than the allowable temperature limit of the substrate 100.

In the case of employing GRTA treatment, the heat treatment period is preferably 1 minute to 100 minutes long. For example, GRTA treatment is preferably performed at 650° C. for approximately 3 minutes to 6 minutes. By employing the above-described GRTA treatment, heat treatment can be performed in a short time; therefore, an adverse effect of heat on the substrate 100 can be reduced. That is, the upper limit of the heat treatment temperature can be increased in that case as compared to the case where heat treatment is performed for a long time. In addition, the crystalline region 110 can be easily formed in the region including the surface of the oxide semiconductor layer 106a.

In the second heat treatment, it is preferable that hydrogen (including water) or the like be not contained in a treatment atmosphere. For example, the purity of an inert gas which is introduced into a heat treatment apparatus is set to 6N (99.9999%, that is, an impurity concentration is 1 ppm or lower) or more, preferably, 7N (99.99999%, that is, an impurity concentration is 0.1 ppm or lower) or more. Instead of the inert gas, an oxygen gas in which hydrogen (including water) or the like is sufficiently reduced, a $N_2O$ gas, an ultra-dry air (with a dew point of −40° C. or lower, preferably −60° C. or lower), or the like may be used.

Note that the second heat treatment may be performed at any timing as long as it is performed after the oxide semiconductor layer 106 is formed. Therefore, it is possible to perform heat treatment which serves as both the first heat treatment and the second heat treatment, for example. In that case, either the first heat treatment or the second heat treatment is performed. In addition, the second heat treatment may be performed once or plural times.

In the crystalline region 110 formed in such a manner, a crystal in an oxide semiconductor is aligned such that its c-axis is in a direction substantially perpendicular to the surface of the oxide semiconductor layer. Here, "substantially perpendicular" means being within ±10° from a perpendicular direction.

For example, in the case where an In—Ga—Zn—O-based oxide semiconductor material is used for the oxide semiconductor layer 106a, the crystalline region 110 can include a crystal represented by $InGaO_3(ZnO)_m$ (m: an integer), a crystal represented by $In_2Ga_2ZnO_7$, or the like. Owing to the second heat treatment, such a crystal is aligned such that its c-axis is in a direction substantially perpendicular to the surface of the oxide semiconductor layer 106a.

Here, the above-described crystal includes any of In, Ga, and Zn, and can be considered to have a stacked structure of layers parallel to a-axis and b-axis. Specifically, the above-described crystal has a structure in which a layer including In and a layer not including In (a layer including Ga or Zn) are stacked in the c-axis direction.

In the In—Ga—Zn—O-based oxide semiconductor crystal, the conductivity of the layer including In in a direction parallel to a-axis and b-axis is favorable. This is due to the fact that electrical conductivity is mainly controlled by In in the In—Ga—Zn—O-based oxide semiconductor crystal and the fact that the 5s orbital of one In atom overlaps with the 5s orbital of an adjacent In atom and thereby a carrier path is formed. In a direction perpendicular to the above-described layer (that is, the c-axis direction), an insulating property is increased.

By including the crystalline region 110 as described above, the oxide semiconductor layer 106a can have electrical anisotropy. In the above-described example, the electrical conductivity in a direction parallel to the surface of the oxide semiconductor layer 106a is increased, and the insulating property in a direction perpendicular to the surface of the oxide semiconductor layer 106a is increased. Therefore, with the use of the oxide semiconductor layer 106a including the crystalline region 110 as described above, a semiconductor device having favorable electrical characteristics can be realized.

Note that it is preferable that an amorphous structure or the like remain below the crystalline region 110 because carriers flowing in the crystalline region 110 can be prevented from being affected by the interface with the insulating layer 102.

Figure 13A:
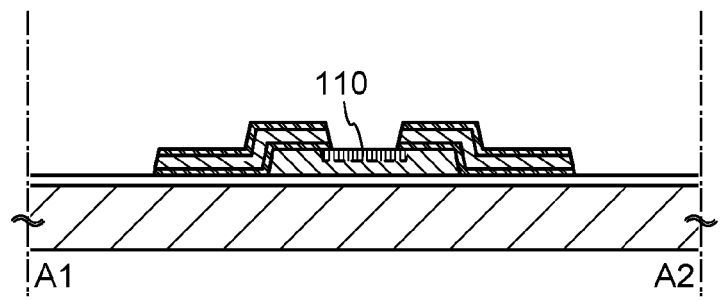
FIGS. 13A to 13D are cross-sectional views illustrating a manufacturing process of a semiconductor device.
Figure 13B:
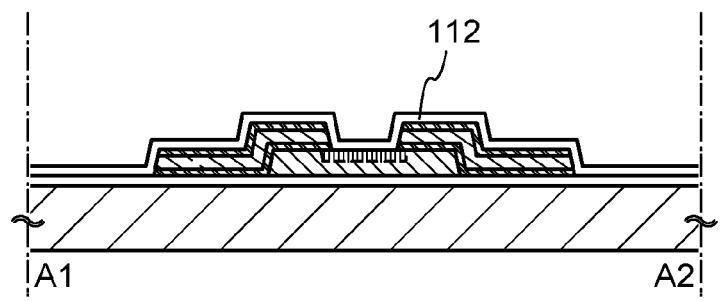

Next, the gate insulating layer 112 is formed in contact with part of the oxide semiconductor layer 106a without exposure to the air (see FIG. 13B). The gate insulating layer 112 can be formed by a CVD method, a sputtering method, or the like. The gate insulating layer 112 is preferably formed so as to include silicon oxide, silicon nitride, silicon oxynitride, silicon nitride oxide, aluminum oxide, hafnium oxide, tantalum oxide, or the like. Note that the gate insulating layer 112 may have a single-layer structure or a stacked structure. There is no particular limitation on the thickness of the gate insulating layer 112; the gate insulating layer 112 can have a thickness of 10 nm to 500 nm, for example.

Note that an i-type or substantially i-type oxide semiconductor obtained by removing an impurity or the like (a purified oxide semiconductor) is highly susceptible to interface states or interface charges; therefore, the gate insulating layer 112 needs to have high quality.

For example, a high-density plasma CVD method using a microwave (e.g., 2.45 GHz) is favorable in that the gate insulating layer 112 can be dense and have high withstand voltage and high quality. This is because a close contact between a purified oxide semiconductor layer and a high-quality gate insulating layer reduces interface states and produces desirable interface characteristics.

It is needless to say that another method such as a sputtering method or a plasma CVD method can also be employed as long as a high-quality insulating layer can be formed as the gate insulating layer 112. Moreover, it is possible to use an insulating layer whose quality, interface characteristics, or the like is improved with heat treatment performed after formation of the insulating layer. In any case, an insulating layer that has a reduced interface state density and can form a favorable interface with an oxide semiconductor layer, as well as having favorable film quality as the gate insulating layer 112, is provided.

By thus improving characteristics of the interface with the gate insulating layer 112 and eliminating an impurity, particularly hydrogen, water, or the like, from an oxide semiconductor, it is possible to obtain a stable transistor whose threshold voltage ($V_{th}$) does not change with a gate bias-temperature stress test (BT test, e.g., at 85° C. and $2\times10^6$ V/cm for 12 hours).

After that, third heat treatment is preferably performed in an inert gas atmosphere or an oxygen atmosphere. The temperature of the heat treatment is set in the range of 200° C. to 400° C., preferably 250° C. to 350° C. For example, the heat treatment may be performed at 250° C. for 1 hour in a nitrogen atmosphere. The third heat treatment can reduce variation in electrical characteristics of the transistor. Further, by the third heat treatment, oxygen can be supplied to the oxide semiconductor layer 106a. Note that in the case of aiming to supply oxygen to the oxide semiconductor layer 106a, it is preferably to perform the third heat treatment after a silicon oxide film is formed as the gate insulating layer 112 by a sputtering method.

Note that the third heat treatment is performed in this embodiment after the gate insulating layer 112 is formed; there is no particular limitation on the timing of the third heat treatment as long as it is performed after the second heat treatment. In addition, the third heat treatment is not an essential step.

Figure 13C:
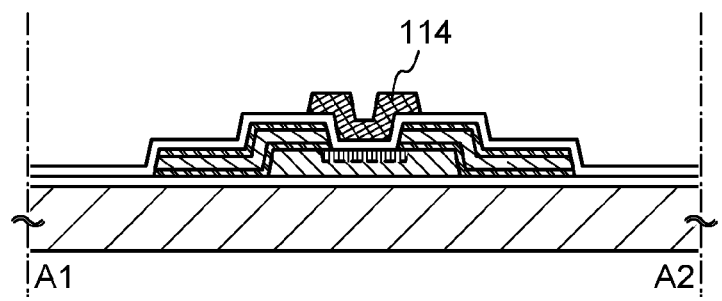

Next, the gate electrode layer 114 is formed over the gate insulating layer 112 in a region overlapping with the oxide semiconductor layer 106a (particularly in a region overlapping with the crystalline region 110) (see FIG. 13C). The gate electrode layer 114 can be formed by forming a conductive layer over the gate insulating layer 112 and then selectively patterning the conductive layer.

The conductive layer can be formed by a PVD method such as a sputtering method, or a CVD method such as a plasma CVD method. The conductive layer can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more elements selected from titanium, tantalum, tungsten, molybdenum, chromium, neodymium, and scandium may be used.

The conductive layer may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer may have a single-layer structure or a stacked structure including two or more layers. For example, the conductive layer may have a single-layer structure of an aluminum film including silicon, a two-layer structure in which a titanium film is stacked over an aluminum film, or a three-layer structure in which a titanium film, an aluminum film, and a titanium film are stacked in this order. Here, the conductive layer is formed using a material including titanium and then processed into the gate electrode layer 114.

Figure 13D:
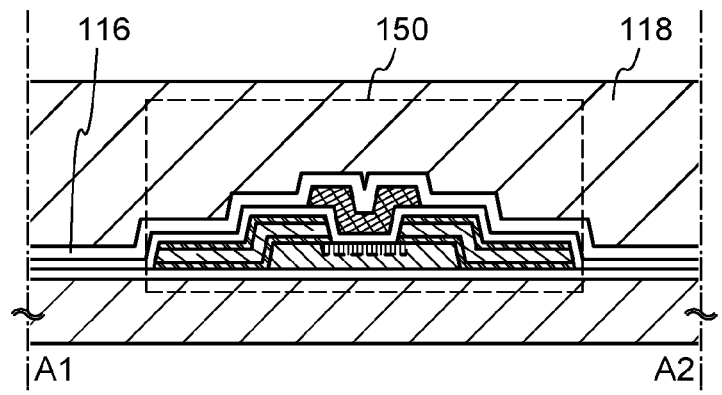

Next, the interlayer insulating layer 116 and the interlayer insulating layer 118 are formed over the gate insulating layer 112 and the gate electrode layer 114 (see FIG. 13D). The interlayer insulating layers 116 and 118 can be formed by a PVD method, a CVD method, or the like. The interlayer insulating layers 116 and 118 can be formed using a material including an inorganic insulating material such as silicon oxide, silicon nitride oxide, silicon nitride, hafnium oxide, aluminum oxide, or tantalum oxide. Note that a stacked structure of the interlayer insulating layers 116 and 118 is used in this embodiment, but an embodiment of the disclosed invention is not limited to this example. A single-layer structure or a stacked structure including three or more layers can also be used.

Note that the interlayer insulating layer 118 is desirably formed so as to have a flat surface. This is because an electrode, a wiring, or the like can be favorably formed over the interlayer insulating layer 118 when the interlayer insulating layer 118 is formed so as to have a flat surface.

Through the above steps, the transistor 150 having the oxide semiconductor layer 106a including the crystalline region 110 is completed.

By the method described in this embodiment, the crystalline region 110 can be formed in the oxide semiconductor layer 106a; accordingly, a semiconductor device having favorable electrical characteristics can be realized.

By the method described in this embodiment, the hydrogen concentration of the oxide semiconductor layer 106a is $5 \times 10^{19}/cm^3$ or less and the off-state current of the transistor is $1 \times 10^{-13}$ A or less which is the measurement limit. A semiconductor device with excellent characteristics can be obtained with the use of the oxide semiconductor layer 106a which is purified by a sufficient reduction in hydrogen concentration and by a supply of oxygen as described above.

As described above, the disclosed invention realizes a semiconductor device with a novel structure and excellent characteristics.

Modified Examples

Next, modified examples of the semiconductor devices illustrated in FIGS. 1A and 1B, FIG. 2, FIG. 3, FIGS. 4A and 4B, FIGS. 5 to 11, FIGS. 12A to 12D, and FIGS. 13A to 13D will be described with reference to FIGS. 14A to 14C, FIGS. 15A to 15C, and FIG. 16. Note that many components of semiconductor devices illustrated in FIGS. 14A to 14C, FIGS. 15A to 15C, and FIG. 16 are similar to those of the semiconductor devices illustrated in FIGS. 1A and 1B, FIG. 2, FIG. 3, FIGS. 4A and 4B, FIGS. 5 to 11, FIGS. 12A to 12D, and FIGS. 13A to 13D; therefore, only different points will be described.

Figure 14A:
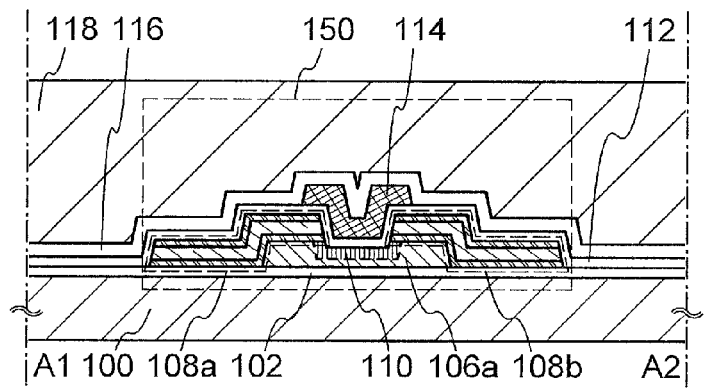
FIGS. 14A to 14C are cross-sectional views each illustrating a semiconductor device.

The transistor 150 illustrated in FIG. 14A includes the oxide semiconductor layer 106a having a depression portion (a groove portion). Note that the depression portion is formed by etching at the time of forming the source or drain electrode layer 108a and the source or drain electrode layer 108b. Accordingly, the depression portion is formed in a region overlapping with the gate electrode layer 114. The depression portion can reduce the thickness of the semiconductor layer in the channel formation region, thereby contributing to the prevention of a short-channel effect.

Figure 14B:
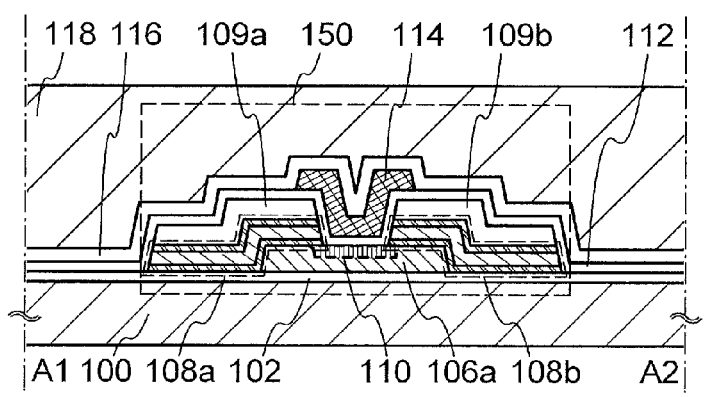

The transistor 150 illustrated in FIG. 14B includes an insulating layer 109a and an insulating layer 109b which have substantially the same shape as the source or drain electrode layer 108a and the source or drain electrode layer 108b, over the source or drain electrode layer 108a and the source or drain electrode layer 108b. In this case, there is an advantage in that capacitance between the source or drain electrode layers and the gate electrode layer (so-called gate capacitance) can be reduced. Note that the expression "substantially the same" or "substantially same" does not necessarily mean being exactly the same in a strict sense and can mean being considered as the same. For example, a difference made by a single etching process is acceptable. Further, the thickness does not need to be the same.

Figure 14C:
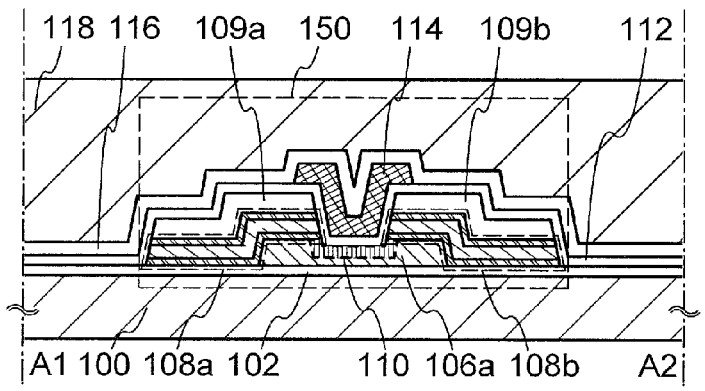

The transistor 150 illustrated in FIG. 14C includes the oxide semiconductor layer 106a having a depression portion (a groove portion) and also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor 150 illustrated in FIG. 14C has features of both the transistor 150 of FIG. 14A and the transistor 150 of FIG. 14B. The effects resulting from the structure are similar to the effects obtained in the cases of FIG. 14A and FIG. 14B.

Figure 15A:
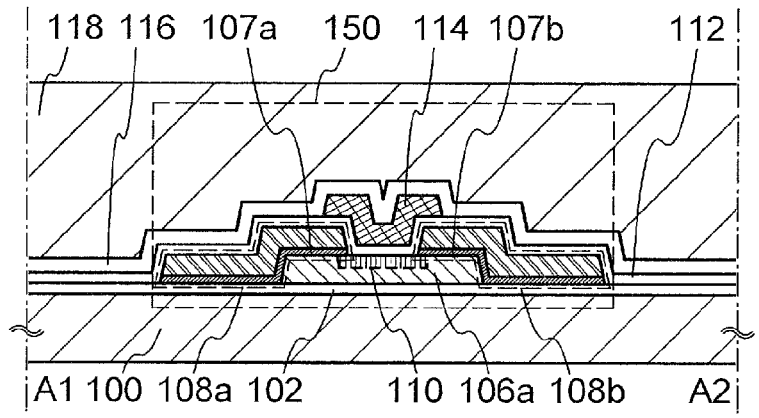
FIGS. 15A to 15C are cross-sectional views each illustrating a semiconductor device.

The transistor 150 illustrated in FIG. 15A includes a conductive layer 107a and a conductive layer 107b formed of a material having a low ability to extract oxygen (a material having low oxygen affinity, such as titanium nitride, tungsten nitride, or platinum) in a region where the source or drain electrode layer 108a and the source or drain electrode layer 108b are in contact with the oxide semiconductor layer 106a. With such a conductive layer having a low ability to extract oxygen, a change of the oxide semiconductor layer to an n-type due to extraction of oxygen can be prevented; accordingly, an adverse effect on transistor characteristics caused by an uneven change of the oxide semiconductor layer to an n-type or the like can be prevented.

Note that the source or drain electrode layer 108a and the source or drain electrode layer 108b having a two-layer structure are employed in FIG. 15A; however, an embodiment of the disclosed invention is not limited to this structure. They may have a single-layer structure of a conductive layer formed of a material having a low ability to extract oxygen or a stacked structure including three or more layers. In the case of a single-layer structure, a single-layer structure of a titanium nitride film can be employed, for example. In the case of a stacked structure, a two-layer structure of a titanium nitride film and a titanium film can be employed, for example.

Figure 15B:
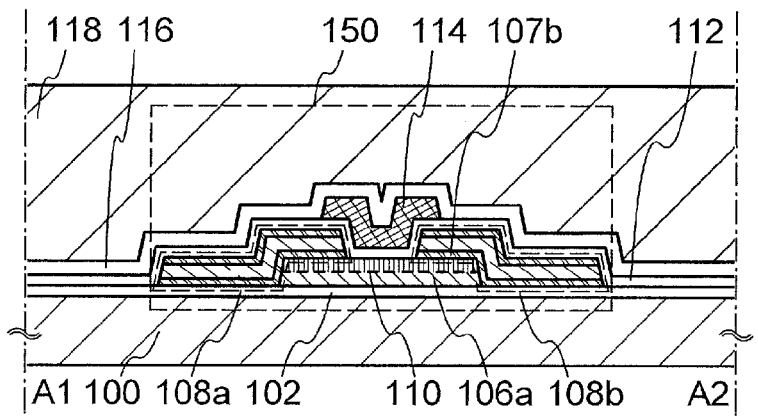

The transistor 150 illustrated in FIG. 15B includes the oxide semiconductor layer 106a including the crystalline region 110 in the entire upper portion. In other words, the crystalline region 110 is more extensive than in the cases of FIGS. 1A and 1B, FIG. 2, FIG. 3, FIGS. 4A and 4B, FIGS. 5 to 11, FIGS. 12A to 12D, and FIGS. 13A to 13D. The crystalline region 110 is formed by heat treatment (first heat treatment) which is performed before formation of the conductive layer 108. In that case, the first heat treatment doubles as the second heat treatment; thus, the second heat treatment may be omitted. In other words, the number of manufacturing steps can be reduced. In addition, the anisotropy of the oxide semiconductor layer 106a can be further enhanced.

Figure 15C:
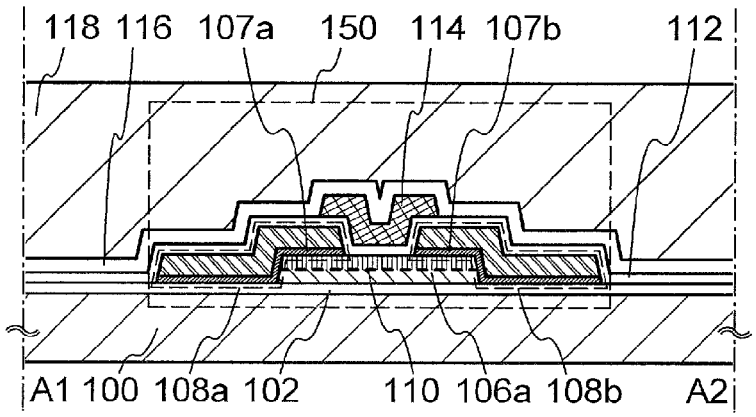

The transistor 150 illustrated in FIG. 15C includes a conductive layer 107a and a conductive layer 107b formed of a material having a low ability to extract oxygen (a material having low oxygen affinity) in a region where the source or drain electrode layer 108a and the source or drain electrode layer 108b are in contact with the oxide semiconductor layer 106a, and also includes the oxide semiconductor layer 106a including the crystalline region 110 in the entire upper portion. In other words, the transistor 150 illustrated in FIG. 15C has features of both the transistor 150 of FIG. 15A and the transistor 150 of FIG. 15B. The effects resulting from the structure are similar to the effects obtained in the cases of FIG. 15A and FIG. 15B.

Figure 16:
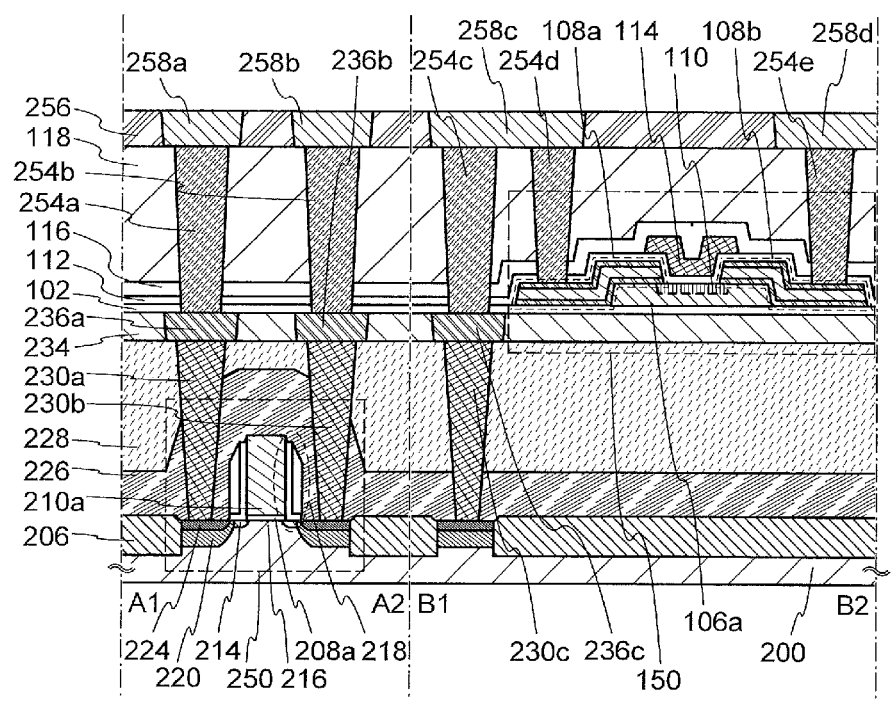
FIG. 16 is a diagram illustrating a semiconductor device.

FIG. 16 illustrates a modified example of a semiconductor device, which includes, in a lower portion, a transistor 250 including a material other than an oxide semiconductor (e.g., silicon) and, in an upper portion, a transistor 150 including an oxide semiconductor. The structure of the transistor 150 including an oxide semiconductor is similar to the transistor 150 illustrated in FIG. 1A.

The transistor 250 includes a channel formation region 216 provided in a substrate 200 including a semiconductor material, impurity regions 214 and high-concentration impurity regions 220 (these regions can be collectively referred to simply as impurity regions) provided such that the channel formation region 216 is sandwiched therebetween, a gate insulating layer 208a provided over the channel formation region 216, a gate electrode layer 210a provided over the gate insulating layer 208a, and a source or drain electrode layer 230a and a source or drain electrode layer 230b electrically connected to the impurity regions 214 (see FIG. 16). For example, a silicon substrate, an SOI substrate, or the like can be used as the substrate 200 including a semiconductor material.

Here, a sidewall insulating layer 218 is formed on a side surface of the gate electrode layer 210a. The high-concentration impurity regions 220 are provided in regions of the substrate 200 which do not overlap with the sidewall insulating layer 218 when seen from a direction perpendicular to a main surface of the substrate 200. Metal compound regions 224 are provided in contact with the high-concentration impurity regions 220. An element isolation insulating layer 206 is provided over the substrate 200 so as to surround the transistor 250. An interlayer insulating layer 226 and an interlayer insulating layer 228 are provided so as to cover the transistor 250. The source or drain electrode layer 230a and the source or drain electrode layer 230b are electrically connected to the metal compound regions 224 through openings formed in the interlayer insulating layer 226, the interlayer insulating layer 228, and an insulating layer 234. In other words, the source or drain electrode layer 230a and the source or drain electrode layer 230b are electrically connected to the high-concentration impurity regions 220 and the impurity regions 214 through the metal compound regions 224. Note that the insulating layer 234 is preferably planarized sufficiently. Specifically, the insulating layer 234 may be planarized by chemical mechanical polishing (CMP) or the like such that the difference in height becomes 3 nm or less, preferably 1 nm or less. By forming the insulating layer 234 which is flat as described above, the planarity of each component formed over the insulating layer 234 can be improved.

The transistor 150 includes the oxide semiconductor layer 106a (including the crystalline region 110) provided over the insulating layer 102, the source or drain electrode layer 108a and the source or drain electrode layer 108b provided over the oxide semiconductor layer 106a and electrically connected to the oxide semiconductor layer 106a, the gate insulating layer 112 provided so as to cover the oxide semiconductor layer 106a, the source or drain electrode layer 108a, and the source or drain electrode layer 108b, and the gate electrode layer 114 provided over the gate insulating layer 112 in a region overlapping with the oxide semiconductor layer 106a (see FIG. 16). Note that it is preferable that the insulating layer 234 be sufficiently planarized as described above because surfaces of the insulating layer 102 and the oxide semiconductor layer 106a formed thereover can be made significantly flat. The crystallinity of a crystalline region formed in the oxide semiconductor layer 106a which is flat as described above can be made excellent.

In addition, the interlayer insulating layer 116 and the interlayer insulating layer 118 are provided over the transistor 150. Here, openings that reach the source or drain electrode layer 108a and the source or drain electrode layer 108b are formed in the gate insulating layer 112, the interlayer insulating layer 116, and the interlayer insulating layer 118. An electrode layer 254d and an electrode layer 254e are formed in contact with the source or drain electrode layer 108a and the source or drain electrode layer 108b, respectively, through the respective openings. Like the electrode layers 254d and 254e, an electrode layer 254a, an electrode layer 254b, and an electrode layer 254c are formed in contact with an electrode layer 236a, an electrode layer 236b, and an electrode layer 236c, respectively, through openings provided in the insulating layer 102, the gate insulating layer 112, the interlayer insulating layer 116, and the interlayer insulating layer 118.

An insulating layer 256 is provided over the interlayer insulating layer 118. An electrode layer 258a, an electrode layer 258b, an electrode layer 258c, and an electrode layer 258d are provided so as to be embedded in the insulating layer 256. Here, the electrode layer 258a is in contact with the electrode layer 254a. The electrode layer 258b is in contact with the electrode layer 254b. The electrode layer 258c is in contact with the electrode layer 254c and the electrode layer 254d. The electrode layer 258d is in contact with the electrode layer 254e.

In other words, the source or drain electrode layer 108a of the transistor 150 is electrically connected to another element (such as the transistor including a material other than an oxide semiconductor) through an electrode layer 230c, the electrode layer 236c, the electrode layer 254c, the electrode layer 258c, and the electrode layer 254d (see FIG. 16). In addition, the source or drain electrode layer 108b of the transistor 150 is electrically connected to another element through the electrode layer 254e and the electrode layer 258d. Note that the structure of connection electrodes (such as the electrode layer 230c, the electrode layer 236c, the electrode layer 254c, the electrode layer 258c, and the electrode layer 254d) is not limited to the above structure, and appropriate addition, omission, or the like is possible.

It is preferable to use a material containing copper for part of the above-described various electrodes (including wirings). In the case of using a material containing copper for part of electrodes and the like, conductivity of the electrodes and the like can be improved. Such electrodes and wirings can be formed by, for example, a method (a so-called damascene method) in which a barrier film (a titanium film, a titanium nitride film, or the like) is formed by a PVD method or a CVD method in an opening provided in an insulating layer and then a copper film is formed by a plating method, or the like.

As illustrated in FIG. 16, in an embodiment of the disclosed invention, an oxide semiconductor layer including a crystalline region can be formed over a given surface of a variety of substrates (a semiconductor substrate, an insulating substrate, or a metal substrate), insulating films, semiconductor films, metal films, or the like. In other words, a crystalline oxide semiconductor layer can be formed with no difficulty over a substrate provided with an integrated circuit. Therefore, three-dimensional integration can be easily realized.

As described above, an embodiment of the disclosed invention can be modified into various modes. In addition, a modified example is not limited to the above example. For example, the structures of FIG. 14A, FIG. 14B, FIG. 14C, FIG. 15A, FIG. 15B, FIG. 15C, and FIG. 16 may be combined as appropriate as another modified example. It is needless to say that addition, omission, and the like are possible within the scope of the description in this specification or the like.

The structures, methods, and the like described in this embodiment can be combined as appropriate with any of the structures, methods, and the like described in other embodiments.

Embodiment 2

In this embodiment, semiconductor devices having structures different from the semiconductor devices of the above embodiment, and a manufacturing method thereof will be described with reference to FIGS. 17A and 17B, FIGS. 18A to 18C, FIGS. 19A to 19C, FIGS. 20A to 20D, FIGS. 21A to 21C, and FIGS. 22A to 22C. Note that the structures described in this embodiment are similar to the structures described in the above embodiment in many points; therefore, only different points will be mainly described below.

<Structure of Semiconductor Device>

Figure 17A:
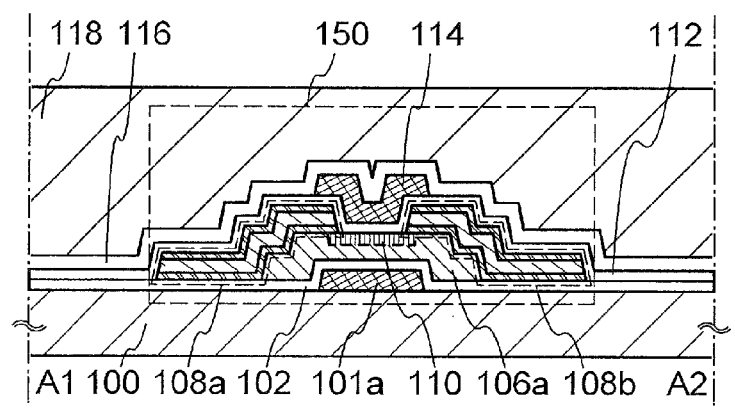
FIGS. 17A and 17B are cross-sectional views each illustrating a semiconductor device.
Figure 17B:
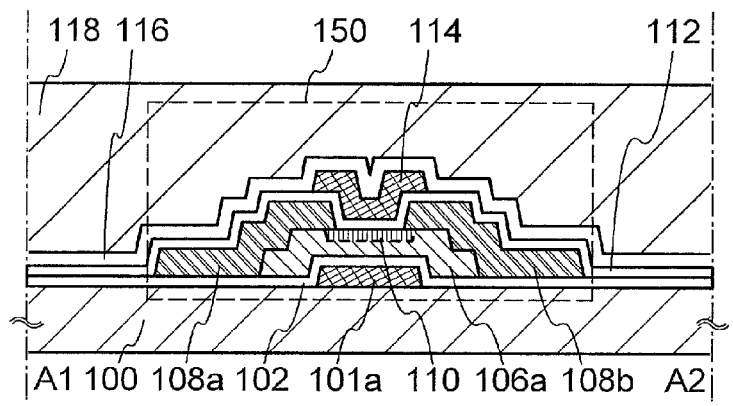

FIGS. 17A and 17B are cross-sectional views each illustrating a transistor 150 which is an example of a structure of a semiconductor device.

A point different from the structures of FIGS. 1A and 1B is that a gate electrode layer 101a is provided below the oxide semiconductor layer 106a. In other words, the transistor 150 illustrated in FIG. 17A or 17B includes a gate electrode layer 101a over a substrate 100, an insulating layer 102 covering the gate electrode layer 101a, an oxide semiconductor layer 106a over the insulating layer 102, a crystalline region 110 in the oxide semiconductor layer 106a, a source or drain electrode layer 108a and a source or drain electrode layer 108b electrically connected to the oxide semiconductor layer 106a, a gate insulating layer 112 covering the oxide semiconductor layer 106a, the source or drain electrode layer 108a, and the source or drain electrode layer 108b, and a gate electrode layer 114 over the gate insulating layer 112 (see FIGS. 17A and 17B). Here, the insulating layer 102 also functions as a gate insulating layer. In addition, FIG. 17A illustrates the case where the source or drain electrode layer 108a and the source or drain electrode layer 108b have a stacked structure, and FIG. 17B illustrates the case where the source or drain electrode layer 108a and the source or drain electrode layer 108b have a single-layer structure. Note that in the case of a single-layer structure, it is easy to realize a favorable tapered shape.

In a manner similar to the structures illustrated in FIGS. 1A and 1B, the oxide semiconductor layer 106a includes the crystalline region 110. The region corresponds to a region including a surface of the oxide semiconductor layer 106a, in other words, a region including a portion in contact with the gate insulating layer 112.

In addition, an interlayer insulating layer 116 and an interlayer insulating layer 118 are provided over the transistor 150. Note that the interlayer insulating layer 116 and the interlayer insulating layer 118 are not essential components and therefore may be omitted as appropriate.

The details of each component are omitted here, for which the above embodiment can be referred to.

As in the structures illustrated in FIGS. 17A and 17B, with the use of the oxide semiconductor layer 106a which is purified and includes the crystalline region 110, a semiconductor device having favorable electrical characteristics can be realized.

In addition, the crystalline region 110 is stable as compared to the other region in the oxide semiconductor layer 106a, and thus can prevent entry of an impurity (e.g., moisture or the like) into the oxide semiconductor layer 106a. Therefore, the reliability of the oxide semiconductor layer 106a can be improved.

Further, with the gate electrode layer 101a which is a so-called back gate, electrical characteristics of the transistor 150 can be easily controlled. Note that a potential the same as or different from that applied to the gate electrode layer 114 may be applied to the gate electrode layer 101a. Alternatively, the gate electrode layer 101a may be in a floating state.

<Manufacturing Method of Semiconductor Device>

Next, a manufacturing method of the transistor 150 which is an example of a structure of a semiconductor device will be described with reference to FIGS. 18A to 18C, FIGS. 19A to 19C, and FIGS. 20A to 20D.

Figure 18A:
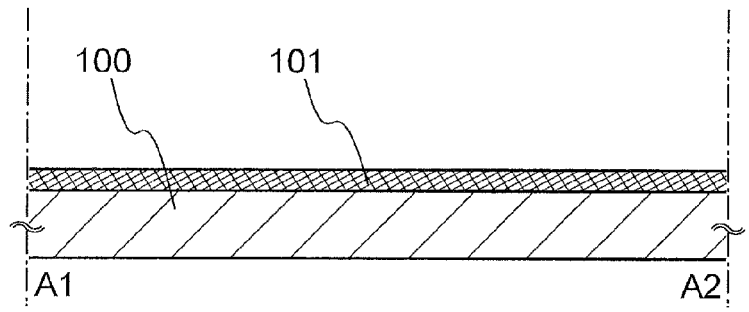
FIGS. 18A to 18C are cross-sectional views illustrating a manufacturing process of a semiconductor device.
Figure 18B:
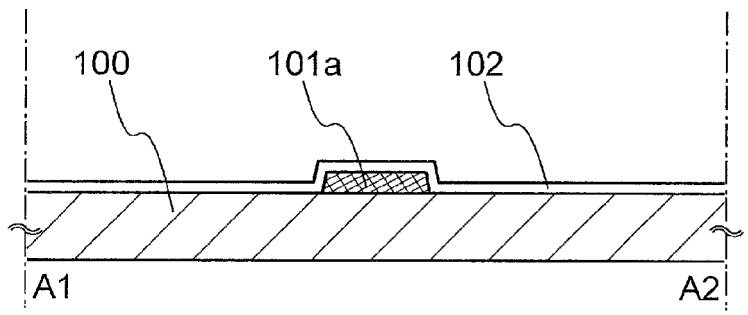

First, a conductive layer 101 is formed over the substrate 100 (see FIG. 18A). The details of the substrate 100 are omitted here, for which the above embodiment can be referred to.

The conductive layer 101 can be formed by a PVD method such as a sputtering method, or a CVD method such as a plasma CVD method. The conductive layer 101 can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more elements selected from titanium, tantalum, tungsten, molybdenum, chromium, neodymium, and scandium may be used.

The conductive layer 101 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 101 may have either a single-layer structure or a stacked structure including two or more layers. In an embodiment of the disclosed invention, since heat treatment at relatively high temperature is performed after formation of the conductive layer 101, the conductive layer 101 is preferably formed using a material having high heat resistance. As the material having high heat resistance, titanium, tantalum, tungsten, molybdenum, or the like can be given, for example. Polysilicon whose conductivity is increased by addition of an impurity element or the like can also be used.

Next, the conductive layer 101 is selectively etched; thus, the gate electrode layer 101a is formed. Then, the insulating layer 102 is formed to cover the gate electrode layer 101a (see FIG. 18B).

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light whose wavelength is several nanometers to several tens of nanometers, which is extremely short. In light exposure using extreme ultraviolet light, resolution is high and depth of focus is large, which are suitable for miniaturization.

The gate electrode layer 101a is a so-called back gate. With the gate electrode layer 101a, electric field in the oxide semiconductor layer 106a can be controlled, whereby electrical characteristics of the transistor 150 can be controlled. Note that the gate electrode layer 101a may be electrically connected to another wiring, electrode, or the like so that a potential is applied to the gate electrode layer 101a, or may be insulated so as to be in a floating state.

Note that a "gate electrode" commonly means a gate electrode whose potential can be controlled intentionally; a "gate electrode" in this specification also means a gate electrode whose potential is not intentionally controlled. For example, the conductive layer which is insulated and in a floating state as described above is, in some cases, called a "gate electrode layer."

The insulating layer 102 functions as a base and also as a gate insulating layer. The insulating layer 102 can be formed by a CVD method, a sputtering method, or the like. The insulating layer 102 is preferably formed so as to include silicon oxide, silicon nitride, silicon oxynitride, silicon nitride oxide, aluminum oxide, hafnium oxide, tantalum oxide, or the like. Note that the insulating layer 102 may have a single-layer structure or a stacked structure. There is no particular limitation on the thickness of the insulating layer 102; the insulating layer 102 can have a thickness of 10 nm to 500 nm, for example.

If hydrogen, water, or the like is contained in the insulating layer 102, hydrogen may enter the oxide semiconductor layer or extract oxygen from the oxide semiconductor layer, whereby characteristics of the transistor may be degraded. Therefore, it is desirable to form the insulating layer 102 so as to include as little hydrogen or water as possible.

In the case of using a sputtering method or the like, for example, it is desirable that the insulating layer 102 be formed in a state where moisture remaining in the treatment chamber is removed. In order to remove moisture remaining in the treatment chamber, an entrapment vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the insulating layer 102 can be reduced.

When the insulating layer 102 is formed, it is desirable to use a high-purity gas in which an impurity such as hydrogen or water is reduced to a concentration of approximately several parts per million (preferably several parts per billion).

Note that the insulating layer 102 needs to have high quality in a manner similar to the gate insulating layer 112. Therefore, the insulating layer 102 is preferably formed by a method that can be employed for the gate insulating layer 112. The details are omitted here, for which the above embodiment can be referred to.

Figure 18C:
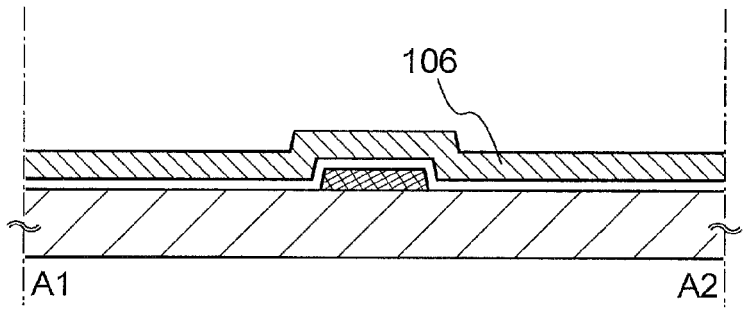

Next, an oxide semiconductor layer 106 is formed over the insulating layer 102 (see FIG. 18C). For also the details of the oxide semiconductor layer 106, the above embodiment can be referred to.

Figure 19A:
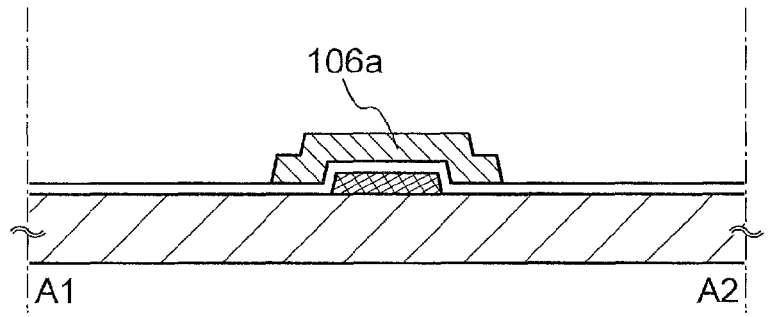
FIGS. 19A to 19C are cross-sectional views illustrating a manufacturing process of a semiconductor device.

Next, the oxide semiconductor layer 106 is processed by a method such as etching using a mask; thus, the oxide semiconductor layer 106a having an island shape is formed (see FIG. 19A). Here, it needs to be noted that the oxide semiconductor layer 106a is formed in the region overlapping with the gate electrode layer 101a. For the details, the above embodiment can be referred to.

After that, heat treatment (first heat treatment) is preferably performed on the oxide semiconductor layer 106a. Water (including a hydroxyl group), hydrogen, or the like contained in the oxide semiconductor layer 106a can be removed by the first heat treatment. For example, the temperature of the first heat treatment can be set higher than or equal to 300° C. and lower than 550° C., preferably higher than or equal to 400° C. and lower than 550° C. Note that the first heat treatment may double as second heat treatment (heat treatment for forming a crystalline region) to be performed later. In that case, the temperature of the heat treatment is preferably set higher than or equal to 550° C. and lower than or equal to 850° C. The details of the heat treatment are omitted here, for which the above embodiment can be referred to.

Figure 19B:
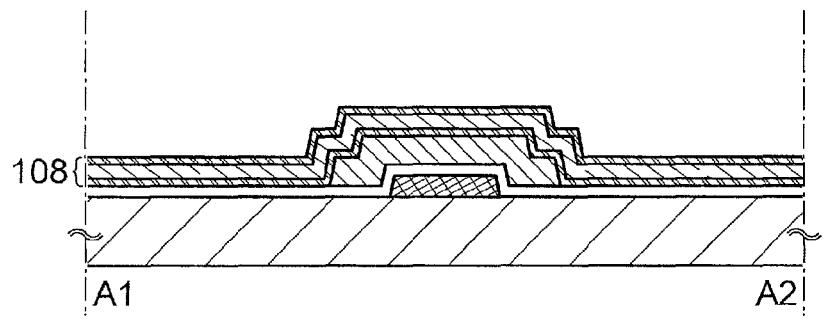
Figure 19C:
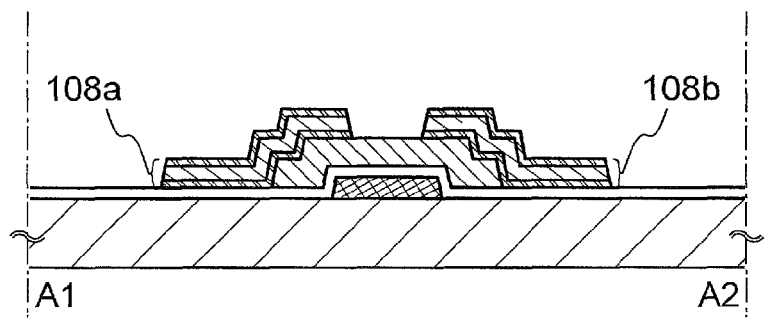

Next, a conductive layer 108 is formed so as to be in contact with the oxide semiconductor layer 106a (see FIG. 19B). Then, the conductive layer 108 is selectively etched; thus, the source or drain electrode layer 108a and the source or drain electrode layer 108b are formed (see FIG. 19C). For the details of the conductive layer 108, the source or drain electrode layer 108a, the source or drain electrode layer 108b, the etching step, and the like, the above embodiment can be referred to.

Next, heat treatment (second heat treatment) is performed on the oxide semiconductor layer 106a. By the second heat treatment, the crystalline region 110 is formed in a region including the surface of the oxide semiconductor layer 106a (see FIG. 20A). Note that the range of the crystalline region 110 varies depending on the material of the oxide semiconductor layer 106a, the conditions of the heat treatment, and the like. For example, the crystalline region 110 can be formed to the lower interface of the oxide semiconductor layer 106a. For the details of the second heat treatment and the like, the above embodiment can be referred to.

Figure 20A:
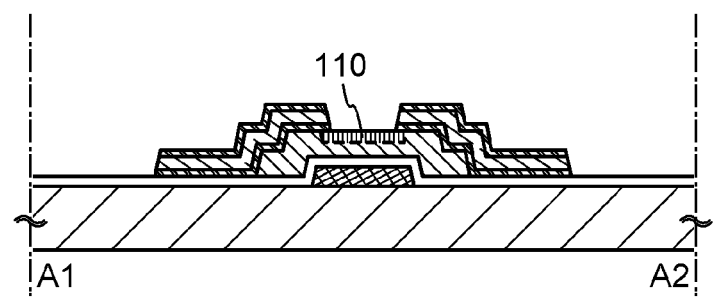
FIGS. 20A to 20D are cross-sectional views illustrating a manufacturing process of a semiconductor device.
Figure 20B:
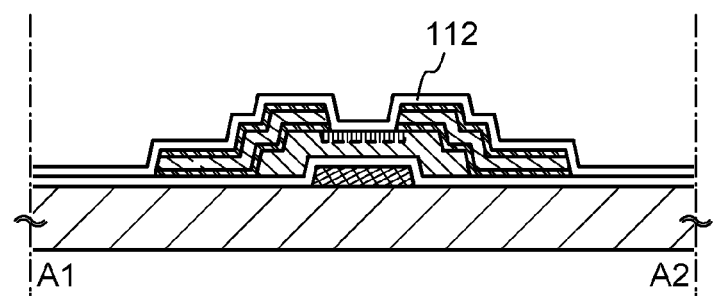
Figure 20C:
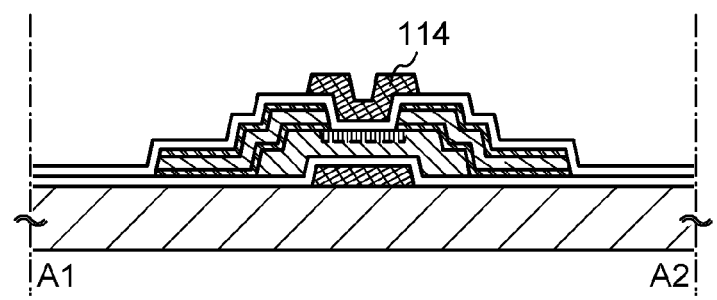
Figure 20D:
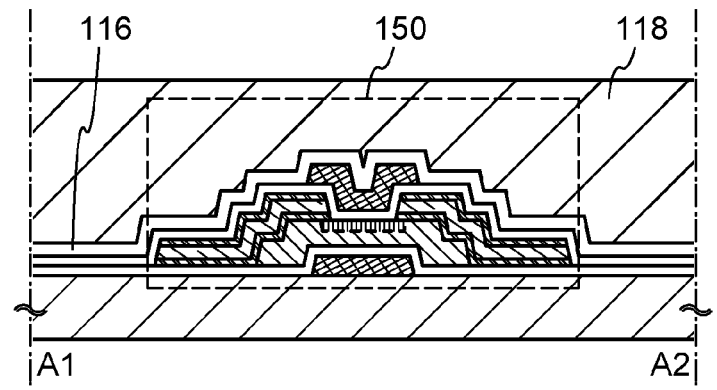

Next, the gate insulating layer 112 is formed in contact with part of the oxide semiconductor layer 106a without exposure to the air (see FIG. 20B). After that, the gate electrode layer 114 is formed over the gate insulating layer 112 in a region overlapping with the oxide semiconductor layer 106a (particularly in a region overlapping with the crystalline region 110) (see FIG. 20C). Then, the interlayer insulating layer 116 and the interlayer insulating layer 118 are formed over the gate insulating layer 112 and the gate electrode layer 114 (see FIG. 20D). For the details of the above steps, the above embodiment can be referred to.

By the method described in this embodiment, the crystalline region 110 can be formed in the oxide semiconductor layer 106a; accordingly, a semiconductor device having favorable electrical characteristics can be realized.

By the method described in this embodiment, the hydrogen concentration of the oxide semiconductor layer 106a is $5 \times 10^{19}/cm^3$ or less and the off-state current of the transistor is $1 \times 10^{-13}$ A or less which is the measurement limit. A semiconductor device with excellent characteristics can be obtained with the use of the oxide semiconductor layer 106a that is purified by a sufficient reduction in hydrogen concentration and by a supply of oxygen as described above.

Further, with the gate electrode layer serving as a so-called back gate, electrical characteristics of the semiconductor device can be easily controlled.

As described above, the disclosed invention realizes a semiconductor device with a novel structure and excellent characteristics.

Modified Examples

Next, modified examples of the semiconductor devices illustrated in FIGS. 17A and 17B, FIGS. 18A to 18C, FIGS. 19A to 19C, and FIGS. 20A to 20D will be described with reference to FIGS. 21A to 21C and FIGS. 22A to 22C. Note that many components of the semiconductor devices illustrated in FIGS. 21A to 21C and FIGS. 22A to 22C are similar to those of the semiconductor devices illustrated in FIGS. 17A and 17B, FIGS. 18A to 18C, FIGS. 19A to 19C, and FIGS. 20A to 20D; therefore, only different points will be described.

Figure 21A:
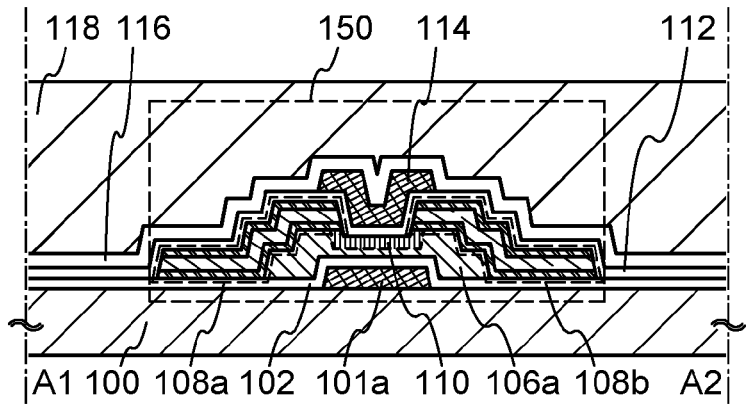
FIGS. 21A to 21C are cross-sectional views each illustrating a semiconductor device.

The transistor 150 illustrated in FIG. 21A includes the oxide semiconductor layer 106a having a depression portion (a groove portion). Note that the depression portion is formed by etching at the time of forming the source or drain electrode layer 108a and the source or drain electrode layer 108b. Accordingly, the depression portion is formed in a region overlapping with the gate electrode layer 114. The depression portion can reduce the thickness of the semiconductor layer in the channel formation region, thereby contributing to the prevention of a short-channel effect.

Figure 21B:
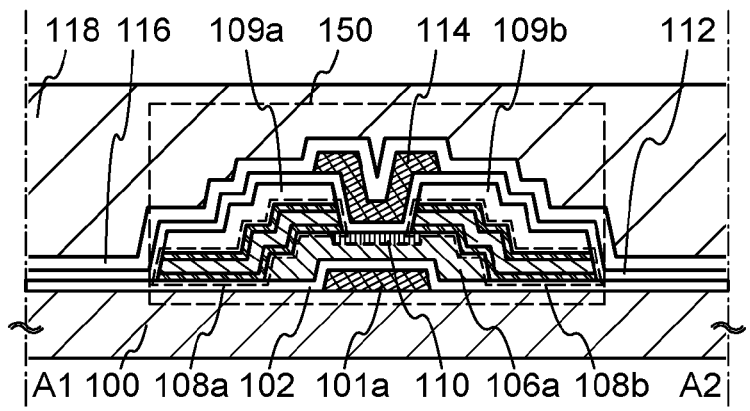

The transistor 150 illustrated in FIG. 21B includes an insulating layer 109a and an insulating layer 109b which have substantially the same shape as the source or drain electrode layer 108a and the source or drain electrode layer 108b, over the source or drain electrode layer 108a and the source or drain electrode layer 108b. In this case, there is an advantage in that capacitance between the source or drain electrode layers and the gate electrode layer (so-called gate capacitance) can be reduced. Note that the expression "substantially the same" or "substantially same" does not necessarily mean being exactly the same in a strict sense and can mean being considered as the same. For example, a difference made by a single etching process is acceptable. Further, the thickness does not need to be the same.

Figure 21C:
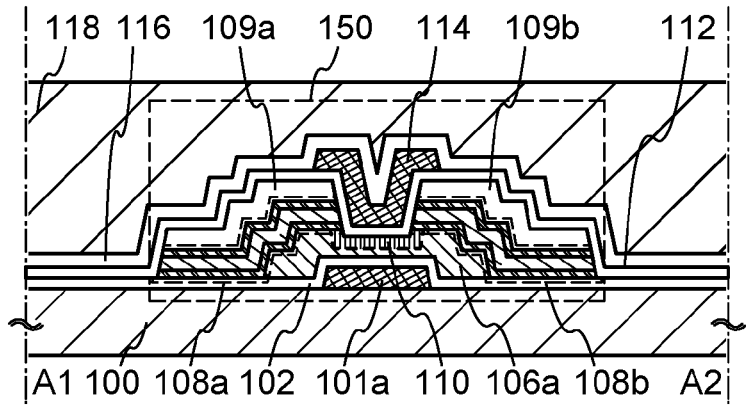

The transistor 150 illustrated in FIG. 21C includes the oxide semiconductor layer 106a having a depression portion (a groove portion) and also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor 150 illustrated in FIG. 21C has features of both the transistor 150 of FIG. 21A and the transistor 150 of FIG. 21B. The effects resulting from the structure are similar to the effects obtained in the cases of FIG. 21A and FIG. 21B.

Figure 22A:
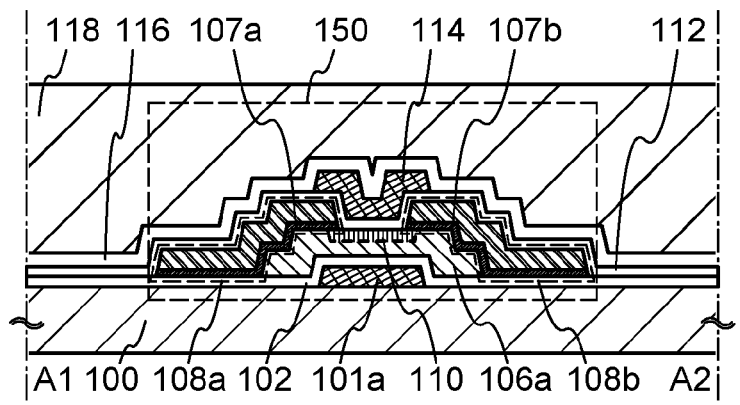
FIGS. 22A to 22C are cross-sectional views each illustrating a semiconductor device.

The transistor 150 illustrated in FIG. 22A includes a conductive layer 107a and a conductive layer 107b formed of a material having a low ability to extract oxygen (a material having low oxygen affinity, such as titanium nitride, tungsten nitride, or platinum) in a region where the source or drain electrode layer 108a and the source or drain electrode layer 108b are in contact with the oxide semiconductor layer 106a. With the conductive layers having a low ability to extract oxygen as described above, a change to an n-type due to extraction of oxygen can be prevented; accordingly, an adverse effect on transistor characteristics caused by an uneven change to an n-type or the like can be prevented.

Note that the source or drain electrode layer 108a and the source or drain electrode layer 108b having a two-layer structure are employed in FIG. 22A; however, an embodiment of the disclosed invention is not limited to this structure. They may have a single-layer structure of a conductive layer formed of a material having a low ability to extract oxygen or a stacked structure including three or more layers. In the case of a single-layer structure, a single-layer structure of a titanium nitride film can be employed, for example. In the case of a stacked structure, a two-layer structure of a titanium nitride film and a titanium film can be employed, for example.

Figure 22B:
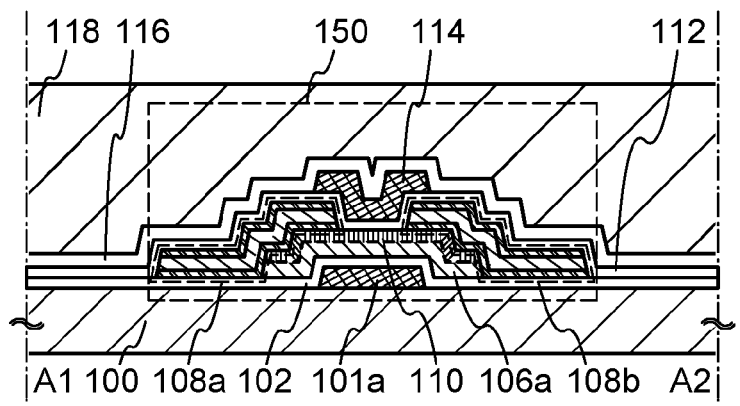

The transistor 150 illustrated in FIG. 22B includes the oxide semiconductor layer 106a including the crystalline region 110 in the entire upper portion. In other words, the crystalline region 110 is more extensive than in the case of FIGS. 17A and 17B, FIGS. 18A to 18C, FIGS. 19A to 19C, and FIGS. 20A to 20D. The crystalline region 110 is formed by heat treatment (first heat treatment) which is performed before formation of the conductive layer 108. In that case, the first heat treatment doubles as the second heat treatment; thus, the second heat treatment may be omitted. In other words, the number of manufacturing steps can be reduced. In addition, the anisotropy of the oxide semiconductor layer 106a can be further enhanced.

Figure 22C:
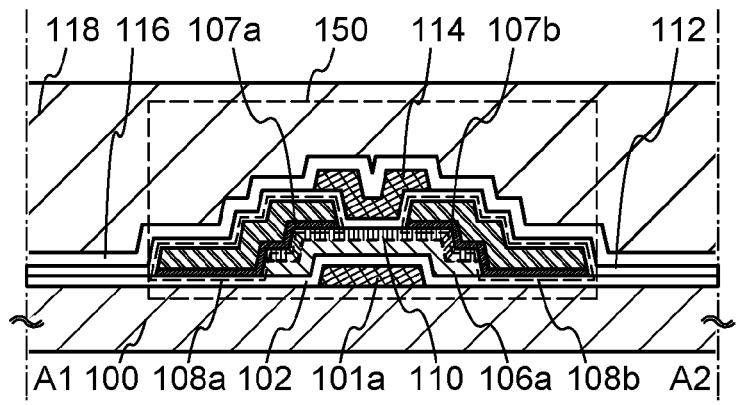

The transistor 150 illustrated in FIG. 22C includes a conductive layer 107a and a conductive layer 107b formed of a material having a low ability to extract oxygen (a material having low oxygen affinity) in a region where the source or drain electrode layer 108a and the source or drain electrode layer 108b are in contact with the oxide semiconductor layer 106a, and also includes the oxide semiconductor layer 106a including the crystalline region 110 in the entire upper portion. In other words, the transistor 150 illustrated in FIG. 22C has features of both the transistor 150 of FIG. 22A and the transistor 150 of FIG. 22B. The effects resulting from the structure are similar to the effects obtained in the cases of FIG. 22A and FIG. 22B.

In addition, as described in the above embodiment, a structure can also be employed, which includes, in a lower portion, a transistor 250 including a material other than an oxide semiconductor (e.g., silicon) and, in an upper portion, a transistor 150 including an oxide semiconductor (see FIG. 16). The structure of the transistor 150 including an oxide semiconductor is similar to the transistors 150 illustrated in FIGS. 17A and 17B and the like. For the details, the above embodiment can be referred to.

As described above, an embodiment of the disclosed invention can be modified into various modes. In addition, a modified example is not limited to the above example. For example, the structures of FIG. 21A, FIG. 21B, FIG. 21C, FIG. 22A, FIG. 22B, FIG. 22C, and the like may be combined as appropriate as another modified example. It is needless to say that addition, omission, and the like are possible within the scope of the description in this specification or the like.

The structures, methods, and the like described in this embodiment can be combined as appropriate with any of the structures, methods, and the like described in other embodiments.

Embodiment 3

In this embodiment, examples of electronic devices each including the semiconductor device according to any of the above-described embodiments will be described with reference to FIGS. 23A to 23F. The semiconductor device according to any of the above embodiments has unprecedented excellent characteristics. Therefore, an electronic device with a novel structure can be provided by using the semiconductor device.

Figure 23A:
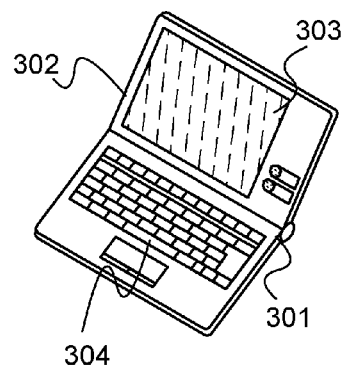
FIGS. 23A to 23F each illustrate an electronic device including a semiconductor device.

FIG. 23A illustrates a notebook personal computer including the semiconductor device according to any of the above embodiments, and includes a main body 301, a housing 302, a display portion 303, a keyboard 304, and the like. The semiconductor device according to the disclosed invention is integrated, mounted on a circuit board or the like, and incorporated in the housing 302. In addition, the semiconductor device according to the disclosed invention can be applied to the display portion 303. By applying the semiconductor device according to the disclosed invention to an integrated circuit board or the like, high-speed circuit operation can be realized. Furthermore, by applying the semiconductor device according to the disclosed invention to the display portion 303, high-quality images can be displayed. By applying the semiconductor device according to the disclosed invention to a personal computer as described above, a high-performance personal computer can be provided.

Figure 23D:
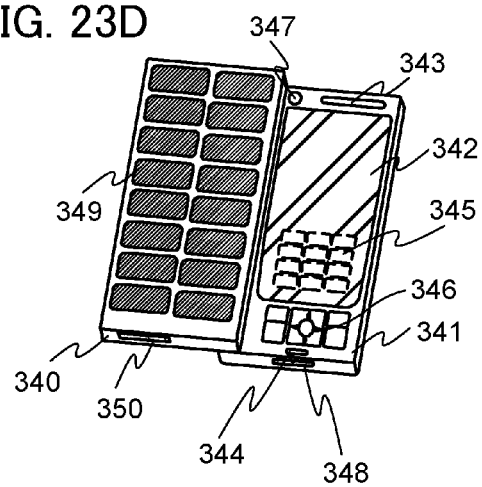
Figure 23B:
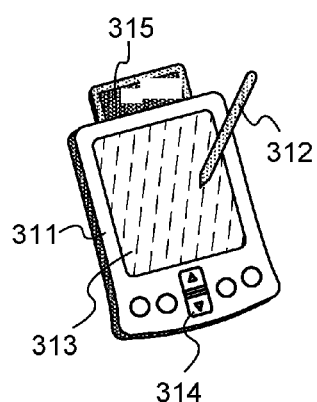

FIG. 23B illustrates a personal digital assistant (PDA) including the semiconductor device according to any of the above embodiments. A main body 311 is provided with a display portion 313, an external interface 315, operation buttons 314, and the like. Further, a stylus 312 is provided as an accessory for operation. The semiconductor device according to the disclosed invention is integrated, mounted on a circuit board or the like, and incorporated in the main body 311. In addition, the semiconductor device according to the disclosed invention can be applied to the display portion 313. By applying the semiconductor device according to the disclosed invention to an integrated circuit board or the like, high-speed circuit operation can be realized. Furthermore, by applying the semiconductor device according to the disclosed invention to the display portion 313, high-quality images can be displayed. By applying the semiconductor device according to the disclosed invention to a personal digital assistant (PDA) as described above, a high-performance personal digital assistant (PDA) can be provided.

Figure 23E:
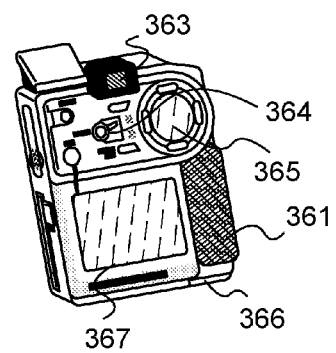
Figure 23C:
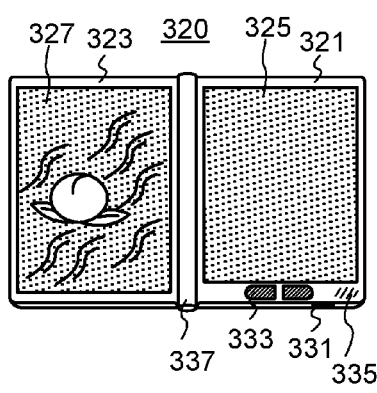

FIG. 23C illustrates an electronic book 320 as an example of electronic paper including the semiconductor device according to any of the above embodiments. The electronic book 320 includes two housings, a housing 321 and a housing 323. The housing 321 is combined with the housing 323 by a hinge 337, so that the electronic book 320 can be opened and closed using the hinge 337 as an axis. With such a structure, the electronic book 320 can be used like a paper book.

The housing 321 includes a display portion 325, and the housing 323 includes a display portion 327. The semiconductor device according to the disclosed invention is integrated, mounted on a circuit board or the like, and incorporated in the housing 323 or the housing 321. The semiconductor device according to the disclosed invention can be applied to the display portion 327. The display portion 325 and the display portion 327 can display a continuous image or different images. A structure for displaying different images enables text to be displayed on the right display portion (the display portion 325 in FIG. 23C) and images to be displayed on the left display portion (the display portion 327 in FIG. 23C). By applying the semiconductor device according to the disclosed invention to an integrated circuit board or the like, high-speed circuit operation can be realized. By applying the semiconductor device according to the disclosed invention to the display portion 327, high-quality images can be displayed.

FIG. 23C illustrates an example in which the housing 321 is provided with an operation portion and the like. For example, the housing 321 is provided with a power switch 331, operation keys 333, a speaker 335, and the like. The operation keys 333 allow pages to be turned. Note that a keyboard, a pointing device, or the like may also be provided on the same side of the housing as the display portion. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. The electronic book 320 can also serve as an electronic dictionary.

In addition, the electronic book 320 can send and receive information wirelessly. Through wireless communication, desired book data or the like can be purchased and downloaded from an electronic book server.

Note that electronic paper can be used for electronic devices in all fields as long as they can display data. For example, to display data, electronic paper can be applied to posters, advertisement in vehicles such as trains, a variety of cards such as credit cards, and the like as well as electronic books. By applying the semiconductor device according to the disclosed invention to electronic paper as described above, high-performance electronic paper can be provided.

FIG. 23D illustrates a cellular phone including the semiconductor device according to any of the above embodiments. The cellular phone includes two housings, a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external memory slot 350, and the like. An antenna is incorporated in the housing 341. The semiconductor device according to the disclosed invention is integrated, mounted on a circuit board or the like, and incorporated in the housing 340 or the housing 341.

The display panel 342 has a touch panel function. A plurality of operation keys 345 displayed as images are indicated by dashed lines in FIG. 23D. The semiconductor device according to the disclosed invention can be applied to the display panel 342. By applying the semiconductor device according to the disclosed invention to the display panel 342, high-quality images can be displayed. Note that the cellular phone includes a booster circuit for increasing a voltage output from the solar cell 349 to a voltage needed for each circuit. It is possible for the cellular phone to have, in addition to the above structure, a structure in which a noncontact IC chip, a small recording device, or the like is formed.

The display panel 342 changes the orientation of display as appropriate in accordance with the application mode. Further, the camera lens 347 is provided on the same side as the display panel 342, so that the cellular phone can be used as a video phone. The speaker 343 and the microphone 344 can be used for videophone calls, recording, and playing sound, etc. as well as voice calls. Moreover, the housings 340 and 341 in a state where they are developed as illustrated in FIG. 23D can be slid so that one is lapped over the other. Therefore, the size of the cellular phone can be reduced, which makes the cellular phone suitable for being carried around.

The external connection terminal 348 can be connected to an AC adapter or a variety of cables such as a USB cable, so that the cellular phone can be charged or can perform data communication. Moreover, the cellular phone can store and transfer a larger amount of data by inserting a recording medium into the external memory slot 350. Further, in addition to the above functions, an infrared communication function, a television reception function, or the like may be provided. By applying the semiconductor device according to the disclosed invention to a cellular phone, a high-performance cellular phone can be provided.

FIG. 23E illustrates a digital camera including the semiconductor device according to any of the above embodiments. The digital camera includes a main body 361, a display portion A 367, an eyepiece 363, an operation switch 364, a display portion B 365, a battery 366, and the like. The semiconductor device according to the disclosed invention can be applied to the display portion A 367 or the display portion B 365. By applying the semiconductor device according to the disclosed invention to the display portion A 367 or the display portion B 365, high-quality images can be displayed. By applying the semiconductor device according to the disclosed invention to a digital camera as described above, a high-performance digital camera can be provided.

Figure 23F:
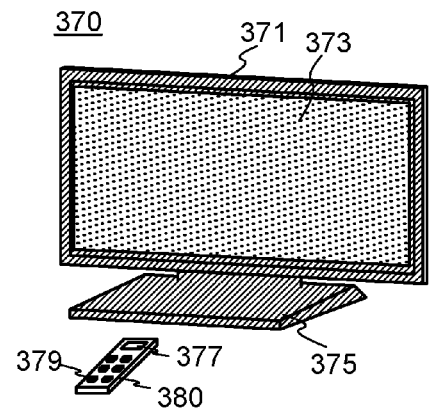

FIG. 23F illustrates a television set including the semiconductor device according to any of the above embodiments. In a television set 370, a display portion 373 is incorporated in a housing 371. Images can be displayed on the display portion 373. Here, the housing 371 is supported by a stand 375. By applying the semiconductor device according to the disclosed invention to the display portion 373, high-speed operation of a switching element can be achieved and an increase in the area of the display portion 373 can be realized.

The television set 370 can be operated with an operation switch included in the housing 371 or by a remote controller 380. Channels and volume can be controlled with a control key 379 included in the remote controller 380, and images displayed on the display portion 373 can thus be controlled. Further, the remote controller 380 can be provided with a display portion 377 for displaying data to be output from the remote controller 380.

Note that the television set 370 preferably includes a receiver, a modem, and the like. The receiver allows the television set 370 to receive a general television broadcast. In addition, the television set 370 is capable of one-way (from a transmitter to a receiver) or two-way (between a transmitter and a receiver, between receivers, or the like) data communication when connected to a communication network by wired or wireless connection via the modem. By applying the semiconductor device according to the disclosed invention to a television set as described above, a high-performance television set can be provided.

The structures, methods, and the like described in this embodiment can be combined as appropriate with any of the structures, methods, and the like described in other embodiments.

This application is based on Japanese Patent Application Serial No. 2009-276334 filed with Japan Patent Office on Dec. 4, 2009, the entire contents of which are hereby incorporated by reference.

What is claimed is:

1. A manufacturing method of a semiconductor device, comprising:
   forming an oxide semiconductor layer over an insulating surface;
   forming a conductive layer electrically connected to the oxide semiconductor layer;
   forming a source electrode layer and a drain electrode layer by etching the conductive layer;
   forming a crystalline region in the oxide semiconductor layer by performing heat treatment to align c-axis of the crystalline region in a direction substantially perpendicular to a surface of the oxide semiconductor layer;
   forming a gate insulating layer over the oxide semiconductor layer and
   forming a gate electrode layer over the gate insulating layer in a region overlapping with the crystalline region.

2. The manufacturing method of a semiconductor device according to claim 1, wherein the heat treatment is performed at a temperature higher than or equal to 550° C. and lower than or equal to 850° C.

3. The manufacturing method of a semiconductor device according to claim 1, wherein a part of the oxide semiconductor layer is removed when the conductive layer is etched.

4. The manufacturing method of a semiconductor device according to claim 1, further comprising a step of forming insulating layers having substantially same shapes as the source electrode layer and the drain electrode layer over the source electrode layer and the drain electrode layer, respectively.

5. The manufacturing method of a semiconductor device according to claim 1, wherein a portion of the source electrode layer and the drain electrode layer in contact with the oxide semiconductor layer is formed using a material having low oxygen affinity.

6. The manufacturing method of a semiconductor device according to claim 1, wherein an oxide semiconductor layer having an amorphous structure is formed as the oxide semiconductor layer, and the amorphous structure remains in a region other than the crystalline region.

7. The manufacturing method of a semiconductor device according to claim 1, wherein the oxide semiconductor layer includes indium and zinc.

8. A manufacturing method of a semiconductor device, comprising:
   forming a first gate electrode layer over an insulating surface;
   forming a first gate insulating layer over the first gate electrode layer;
   forming an oxide semiconductor layer over the first gate insulating layer;
   forming a conductive layer electrically connected to the oxide semiconductor layer;
   forming a source electrode layer and a drain electrode layer by etching the conductive layer;
   forming a crystalline region in the oxide semiconductor layer by performing heat treatment to align c-axis of the crystalline region in a direction substantially perpendicular to a surface of the oxide semiconductor layer;
   forming a second gate insulating layer over the oxide semiconductor layer; and
   forming a second gate electrode layer over the second gate insulating layer in a region overlapping with the crystalline region.

9. The manufacturing method of a semiconductor device according to claim 8, wherein the heat treatment is performed at a temperature higher than or equal to 550° C. and lower than or equal to 850° C.

10. The manufacturing method of a semiconductor device according to claim 8, wherein a part of the oxide semiconductor layer is removed when the conductive layer is etched.

11. The manufacturing method of a semiconductor device according to claim 8, further comprising a step of forming insulating layers having substantially same shapes as the source electrode layer and the drain electrode layer over the source electrode layer and the drain electrode layer, respectively.

12. The manufacturing method of a semiconductor device according to claim 8, wherein a portion of the source electrode layer and the drain electrode layer in contact with the oxide semiconductor layer is formed using a material having low oxygen affinity.

13. The manufacturing method of a semiconductor device according to claim 8, wherein an oxide semiconductor layer having an amorphous structure is formed as the oxide semiconductor layer, and the amorphous structure remains in a region other than the crystalline region.

14. The manufacturing method of a semiconductor device according to claim 8, wherein the oxide semiconductor layer includes indium and zinc.

* * * * *